(12) United States Patent
Oki et al.

(10) Patent No.: US 8,483,256 B2
(45) Date of Patent: Jul. 9, 2013

(54) LASER DIODE ELEMENT ASSEMBLY AND METHOD OF DRIVING THE SAME

(75) Inventors: Tomoyuki Oki, Kanagawa (JP); Masaru Kuramoto, Kanagawa (JP); Rintaro Koda, Tokyo (JP); Hideki Watanabe, Kanagawa (JP); Hiroyuki Yokoyama, Miyagi (JP)

(73) Assignees: Sony Corporation, Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 13/417,998

(22) Filed: Mar. 12, 2012

(65) Prior Publication Data

US 2012/0236886 A1 Sep. 20, 2012

(30) Foreign Application Priority Data

Mar. 17, 2011 (JP) .................................. 2011-058899

(51) Int. Cl.
*H01S 3/08* (2006.01)
(52) U.S. Cl.
USPC .............. 372/99; 372/102; 372/101; 372/98; 372/45.013; 372/44.01; 372/38.02
(58) Field of Classification Search
USPC ............. 372/99, 102, 101, 98, 45.013, 44.01, 372/38.02
See application file for complete search history.

(56) References Cited

U.S. PATENT DOCUMENTS

| | | | | |
|---|---|---|---|---|
| 2002/0064353 | A1* | 5/2002 | Yokoyama | 385/92 |
| 2003/0147448 | A1* | 8/2003 | Hayakawa | 372/97 |
| 2007/0258496 | A1* | 11/2007 | Miyajima et al. | 372/45.01 |

FOREIGN PATENT DOCUMENTS

| | | |
|---|---|---|
| JP | 2002-164614 | 6/2002 |
| JP | 2006-041400 | 2/2006 |

* cited by examiner

*Primary Examiner* — Kinam Park
(74) *Attorney, Agent, or Firm* — K&L Gates LLP

(57) ABSTRACT

A laser diode element assembly includes: a laser diode element; and a light reflector, in which the laser diode element includes (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the laminate structure body includes a ridge stripe structure, and a minimum width $W_{min}$ and a maximum width $W_{max}$ of the ridge stripe structure satisfy $1 < W_{max}/W_{min} < 3.3$ or $6 \leq W_{max}/W_{min} \leq 13.3$.

16 Claims, 18 Drawing Sheets

[EXAMPLE 1A]

[REFERENCE EXAMPLE 1B/COMPARATIVE EXAMPLE 1B]

[EXAMPLE 1C/COMPARATIVE EXAMPLE 1C]

[EXAMPLE 1D/COMPARATIVE EXAMPLE 1D]

[EXAMPLE 1E/COMPARATIVE EXAMPLE 1E]

[EXAMPLE 1F/COMPARATIVE EXAMPLE 1F]

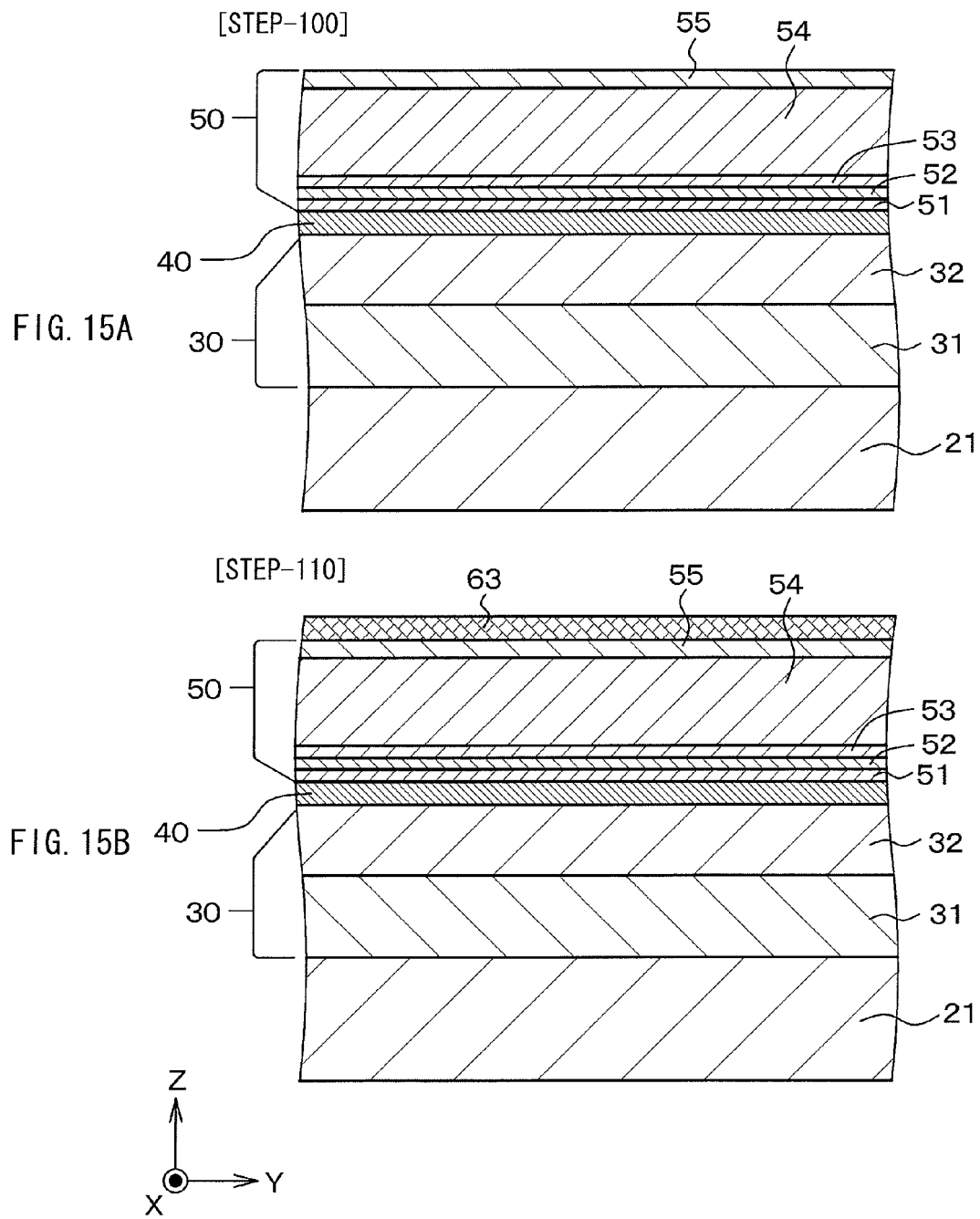

LASER DIODE ELEMENT ASSEMBLY AND METHOD OF DRIVING THE SAME

CROSS REFERENCES TO RELATED APPLICATIONS

The present application claims priority to Japanese Priority Patent Application JP 2011-058899 filed in the Japan Patent Office on Mar. 17, 2011, the entire content of which is hereby incorporated by reference.

BACKGROUND

The present application relates to a laser diode element assembly and a method of driving the same.

Recently, for researches in a leading-edge science region using laser light of pulse duration in the attosecond range or the femtosecond range, ultrashort-pulse/ultrahigh-power lasers have been frequently used. Moreover, a high-power/ultrashort-pulse laser diode element with a light emission wavelength of 405 nm made of a GaN-based compound semiconductor is expected to serve as a light source of a volumetric optical disk system which is expected as a next-generation optical disk system following a Blu-ray optical disk system, or a light source necessary in the medical field, the bioimaging field, or the like.

As the ultrashort-pulse/ultrahigh-power laser, for example, a titanium/sapphire laser is known; however, the titanium/sapphire laser is an expensive and large solid laser light source, which is a main impediment to the spread of the technology. If the ultrashort-pulse/ultrahigh-power laser is realized through the use of a laser diode or a laser diode element, it is considered that a large reduction in size, price, and power consumption of the ultrashort-pulse/ultrahigh-power laser, and high stability of the ultrashort-pulse/ultrahigh-power laser will be achieved, thereby leading to a breakthrough in promoting widespread use of the ultrashort-pulse/ultrahigh-power laser in these fields.

On the other hand, an attempt to shorten pulses from a laser diode element has been actively studied since 1960s in the communications field. As a method of generating short pulses in a laser diode element, a gain switching method, a loss switching method (a Q switching method), and a mode-locking method are known, and in these methods, the laser diode element is combined with a semiconductor amplifier, a non-linear optical element, an optical fiber, or the like to aim at achieving higher power. Mode-locking is further classified into active mode-locking and passive mode-locking. To generate optical pulses based on the active mode-locking, an external resonator structure is configured of a laser diode element with use of a mirror or a lens, and radio-frequency (RF) modulation is applied to the laser diode element. On the other hand, in the passive mode-locking, when a laser diode element with a multielectrode structure is used, optical pulses are allowed to be generated by a simple DC drive.

In laser light sources, achieving higher power is a major issue. In addition, for the convenience of using the laser diode element as a light source, it is frequently desired that laser light emitted from the laser diode element be single-mode light. These issues are major issues in not only pulsed oscillation of laser light but also continuous-wave oscillation. As a method of amplifying light from a laser light source, a semiconductor optical amplifier (SOA) is considered. Herein, the optical amplifier is an amplifier which directly amplifies an optical signal in the form of light without converting the optical signal into an electrical signal, and the optical amplifier has a laser structure without a resonator, and amplifies incident light by an optical gain thereof. However, to reduce manufacturing cost, a light source with a simple configuration without optical components such as an optical amplifier is strongly desired.

SUMMARY

To achieve stabilization in a drive of a laser diode element based on a mode-locking method or a size reduction in the laser diode element, laser diode element assemblies with an external resonator are known from, for example, Japanese Unexamined Patent Application Publication Nos. 2002-164614 and 2006-041400. However, in these patent documents, a technique of achieving higher power is not mentioned.

Therefore, it is desirable to provide a laser diode element assembly capable of achieving higher power and emitting laser light, and a method of driving the laser diode element assembly.

According to a first or second embodiment of the application, there is provided a laser diode element assembly including: a laser diode element; and a light reflector, in which the laser diode element includes (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, and the laminate structure body includes a ridge stripe structure.

In the laser diode element assembly according to the first embodiment of the application, laser light is emitted from a first end surface of the ridge stripe structure, and a part of the laser light is reflected by the light reflector to be returned to the laser diode element, and a remaining part of the laser light exits to outside through the light reflector, the laser light is reflected by a second end surface of the ridge stripe structure, and a minimum width $W_{min}$ and a maximum width $W_{max}$ of the ridge stripe structure satisfy $1<W_{max}/W_{min}<3.3$ or $6 \leq W_{max}/W_{min} \leq 13.3$. It is to be noted that the width on the first end surface of the ridge stripe structure and the width on the second end surface of the ridge stripe structure are preferably, but not exclusively, the maximum width $W_{max}$, and the minimum width $W_{min}$, respectively. The same applies to a method of driving a laser diode element assembly according to a first embodiment of the application which will be described later.

In the laser diode element assembly according to the second embodiment of the application, laser light is emitted from a first end surface of the ridge stripe structure, and the laser light is reflected by the light reflector to be returned to the laser diode element, a part of the laser light exits to outside from the second end surface of the ridge stripe structure, and a minimum width $W_{min}$ and a maximum width $W_{max}$ of the ridge stripe structure satisfy $1<W_{max}/W_{min}<3.3$ or $6 \leq W_{max}/W_{min} \leq 13.3$. It is to be noted that the width on the first end surface of the ridge stripe structure and the width on the second end surface of the ridge stripe structure are preferably, but not exclusively, the maximum width $W_{max}$, and the minimum width $W_{min}$, respectively. The same applies to a method of driving a laser diode element assembly according to a second embodiment of the application which will be described later.

According to a third embodiment of the application, there is provided a laser diode element assembly including: a laser diode element; and an external resonator, in which the laser diode element includes (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the laminate structure body includes a ridge stripe structure, laser light is emitted from a first end surface of the ridge stripe structure, and the laser light is reflected by the external resonator to be returned to the laser diode element, laser light emitted from the first end surface or a second end surface of the ridge stripe structure exits to outside, and a minimum width $W_{min}$ and a maximum width $W_{max}$ of the ridge stripe structure satisfy $1<W_{max}/W_{min}<3.3$ or $6\leq W_{max}/W_{min}\leq 13.3$.

It is to be noted that the width on the first end surface of the ridge stripe structure and the width on the second end surface of the ridge stripe structure are preferably, but not exclusively, the maximum width $W_{max}$, and the minimum width $W_{min}$, respectively. The same applies to a method of driving a laser diode element assembly according to a third embodiment of the application which will be described later.

According to the first or second embodiment of the application, there is provided a method of driving a laser diode element assembly, the laser diode element assembly including a laser diode element and a light reflector, the laser diode element including (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the third compound semiconductor layer further including a saturable absorption region, the second electrode being configured of a first section and a second section, the first section configured to create a forward bias state by passing a current to the first electrode through the light emission region, the second section configured to apply an electric field to the saturable absorption region, the first section and the second section of the second electrode being separated by a separation groove, and the laminate structure body including a ridge stripe structure, in the method of driving a laser diode element assembly according to the first embodiment of the application, in the laser diode element assembly, laser light is emitted from a first end surface of the ridge stripe structure, and a part of the laser light is reflected by the light reflector to be returned to the laser diode element, and a remaining part of the laser light exits to outside through the light reflector, and the laser light is reflected by a second end surface of the ridge stripe structure, and a minimum width $W_{min}$ and a maximum width $W_{max}$ of the ridge stripe structure satisfy $1<W_{max}/W_{min}<3.3$ or $6\leq W_{max}/W_{min}\leq 13.3$, and in the method of driving a laser diode element assembly according to the second embodiment of the application, in the laser diode element assembly, laser light is emitted from a first end surface of the ridge stripe structure, and the laser light is reflected by the light reflector to be returned to the laser diode element, a part of the laser light exits to outside from a second end surface of the ridge stripe structure, and a minimum width $W_{min}$ and a maximum width $W_{max}$ of the ridge stripe structure satisfy $1<W_{max}/W_{min}<3.3$ or $6\leq W_{max}/W_{min}\leq 13.3$.

The method of driving a laser diode element assembly according to the first or second embodiment of the application includes:

while passing a current to the first electrode through the first section of the second electrode and the light emission region, passing a current to the second section of the second electrode through the first electrode and the saturable absorption region, thereby allowing pulsed oscillation to be performed; and while passing a current to the first electrode through the first section of the second electrode and the light emission region, passing a current to the first electrode through the second section of the second electrode and the light emission region, or not passing a current to the first electrode through the second section of the second electrode and the light emission region, thereby allowing continuous-wave oscillation to be performed.

It is to be noted that "passing a current" is equivalent to applying a voltage. The same applies to the following description. Moreover, in the case where, while a current is passed to the first electrode through the first section of the second electrode and the light emission region, a current is passed to the first electrode through the second section of the second electrode and the light emission region, for example, the first section and the second section of the second electrode may be short-circuited. The same applies to the following embodiment. It is to be noted that pulsed oscillation is preferably single-mode pulsed oscillation, and continuous-wave oscillation is preferably single-mode continuous-wave oscillation. The same applies to the following embodiment.

According to a third embodiment of the application, there is provided a method of driving a laser diode element assembly, the laser diode element assembly including a laser diode element and an external resonator, the laser diode element including (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the third compound semiconductor layer further including a saturable absorption region, the second electrode being configured of a first section and a second section, the first section configured to create a forward bias state by passing a current to the first electrode through the light emission region, the second section configured to apply an electric field to the saturable absorption region, the first section and the second section of the second electrode being separated by a separation groove, the laminate structure body including a ridge stripe structure, laser light being emitted from a first end surface of the ridge stripe structure, and the laser light being reflected by the external resonator to be returned to the laser diode element, laser light emitted from the first end surface or a second end surface of the ridge stripe structure exiting to outside, a minimum width $W_{min}$ and a maximum width $W_{max}$ of the ridge stripe structure satisfying $1 < W_{max}/W_{min} < 3.3$ or $6 \leq W_{max}/W_{min} \leq 13.3$, the method including:

while passing a current to the first electrode through the first section of the second electrode and the light emission region, passing a current to the second section of the second electrode through the first electrode and the saturable absorption region, thereby allowing pulsed oscillation to be performed; and while passing a current to the first electrode through the first section of the second electrode and the light emission region, passing a current to the first electrode through the second section of the second electrode and the light emission region, or not passing a current to the first electrode through the second section of the second electrode and the light emission region, thereby allowing continuous-wave oscillation to be performed.

In the laser diode element assemblies and the methods of driving a laser diode element assembly according to the first to third embodiments of the application, the ridge stripe structure having an external resonator structure and having a so-called flare structure with a specified relationship between the minimum width $W_{min}$ and the maximum width $W_{max}$ is included; therefore, higher power is allowed to be achieved.

It is to be understood that both the foregoing general description and the following detailed description are exemplary, and are intended to provide further explanation of the application as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIGS. 15A and 15B are schematic partial sectional views of a substrate and the like for describing a method of manufacturing the laser diode element in Example 1.

DETAILED DESCRIPTION

Figure 1A:
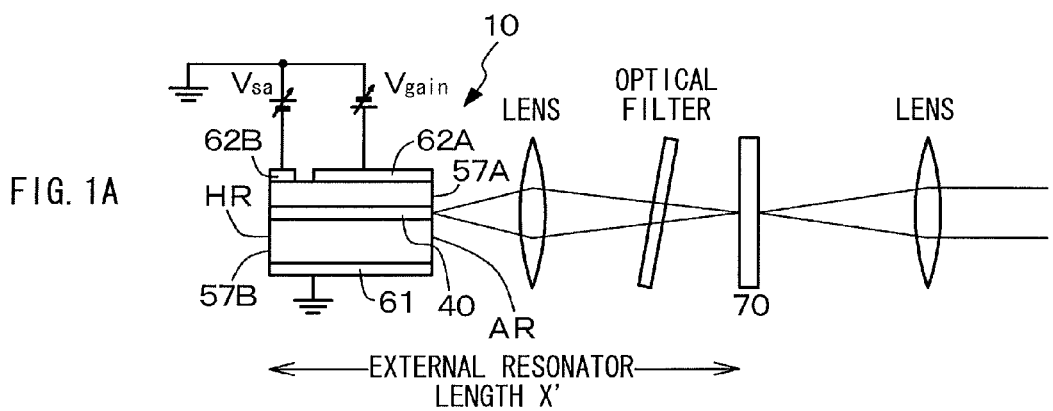
FIGS. 1A and 1B are conceptual diagrams of a laser diode element assembly of Example 1 and FIG. 1C is a schematic plan view of a laser diode element in Example 1 or Example 2.

The present application will be described referring to examples and the accompanying drawings; however, the application is not limited thereto, and various values and materials in the examples are given by way of illustration. It is to be noted that description will be given in the following order.
1. Laser diode element assemblies and methods of driving the same according to first to third embodiments of the present application, and general description
2. Example 1 (Laser diode element assemblies and methods of driving the same according to the first and third embodiments of the application)
3. Example 2 (Laser diode element assemblies and methods of driving the same according to the second and third embodiments of the application), and others Laser Diode Element Assemblies and Methods of Driving the Same According to First to Third Embodiment of the Present Application, and General Description In laser diode element assemblies according to first to third embodiments of the application, or methods of driving a laser diode element assembly according to first to third embodiments of the application, a light reflector or an external resonator may be configured of a mirror (a half mirror in the laser diode element assemblies according to the first and third embodiments of the application or the methods of driving a laser diode element assembly according to the first and third embodiments of the application, a total reflection mirror in the laser diode element assembly or the method of driving the same according to the second embodiment of the application), a chirped mirror, a volume Bragg grating (VBG), or a fiber Bragg grating (FBG).

In the laser diode element assemblies according to the first to third embodiments of the application including the above-described preferred configuration, or the methods of driving a laser diode element assembly according to the first to third embodiments of the application, laser light exiting to outside is preferably single-mode light. Herein, "single-mode" (single-transverse-mode) means that one or more light intensity peaks are observed in a light intensity distribution of a near-field image in a transverse mode, and the light intensity of one of the light intensity peaks constitutes 80% or more, preferably 90% or more of total light intensity.

In the laser diode element assemblies according to the first to third embodiments of the application including the above-described preferred configurations, or the methods of driving a laser diode element assembly according to the first to third embodiments of the application, as described above, a ridge stripe structure has a so-called flare structure, and a minimum width $W_{min}$ of the ridge stripe structure preferably satisfies $1 \times 10^{-6}$ m. In the case where the minimum width $W_{min}$ is smaller than $1 \times 10^{-6}$ m, a laser diode element assembly having a desired light intensity may not be obtained, and in the case where the minimum width $W_{min}$ exceeds $3 \times 10^{-6}$ m, laser light emitted from the laser diode element assembly may not become single-mode light. When the minimum width $W_{min}$ of the ridge stripe structure is within the above-described range, single-transverse-mode laser light is obtainable.

Moreover, in the laser diode element assemblies according to the first to third embodiments of the application including the above-described various preferred configurations, a third compound semiconductor layer may further include a saturable absorption region, and a second electrode may be configured of a first section and a second section, the first section configured to create a forward bias state by passing a current to a first electrode through a light emission region, the second section configured to apply an electric field to the saturable absorption region, and the first section and the second section of the second electrode may be separated by a separation groove. It is to be noted that, for the sake of convenience, a laser diode element with such a configuration and such a structure, or a laser diode element in the methods of driving a laser diode element assembly according to the first to third embodiments of the application may be referred to as "multielectrode type laser diode element". In the multielectrode type laser diode element in the laser diode element assemblies according to the first to third embodiments of the application, laser light exiting to outside may be pulsed oscillation laser light. It is to be noted that, in the multielectrode type laser diode element including such a mode, or in the methods of driving a laser diode element assembly according to the first to third embodiments of the application including the above-described preferred configurations, the saturable absorption region is preferably disposed in a portion of a laminate structure body, the portion disposed closer to an end surface opposite to an end surface facing the light reflector or the external resonator (an end surface where laser light exits to outside), or the saturable absorption region is preferably disposed closer to an end surface opposite to an end surface where laser light exit to outside in the laminate structure body.

Alternatively, in the laser diode element assemblies according to the first to third embodiments of the application including the above-described preferred configurations, modes and the multielectrode type laser diode element, laser light exiting to outside may be continuous-wave oscillation laser light. In the case where laser light exiting to outside from the multielectrode type laser diode element is continuous-wave oscillation laser light, for example, the first section and the second section of the second electrode may be short-circuited, or alternatively, a current may not be passed to the second section of the second electrode.

In the laser diode element assemblies or the methods of driving the same according to the first to third embodiments of the application including the above-described preferred configurations and modes, it is desirable that light intensity $E_{out}$ of laser light emitted from the laser diode element assembly satisfy $E_{out}/E_0 \geqq 1.5$, where light intensity of laser light exiting to outside assuming that $W_{min}=W_{max}$ is established is $E_0$.

In the multielectrode type laser diode element including the above-described preferred various configurations and modes, it is desirable that electrical resistance between the first section and the second section of the second electrode be $1 \times 10$ times or more, preferably $1 \times 10^2$ times or more, more preferably $1 \times 10^3$ times or more as high as electrical resistance between the second electrode and the first electrode. Alternatively, it is desirable that the electrical resistance between the first section and the second section of the second electrode be $1 \times 10^2 \Omega$ or more, preferably $1 \times 10^3 \Omega$ or more, more preferably $1 \times 10^4 \Omega$ or more.

In such a multielectrode type laser diode element, the electrical resistance between the first section and the second section of the second electrode is $1 \times 10$ times or more as high as the electrical resistance between the second electrode and the first electrode, or $1 \times 10^2 \Omega$ or more. Therefore, a leakage current flowing from the first section of the second electrode to the second section is allowed to be reliably suppressed. In other words, a reverse bias voltage applied to the saturable absorption region (carrier non-injection region) is allowed to be increased for pulsed oscillation; therefore, a mode-locking operation in a single mode having laser light of short pulse duration is achievable. Then, such high electrical resistance between the first section and the second section of the second electrode is achievable only by separating the second electrode into the first section and the second section by the separation groove.

Moreover, in the multielectrode type laser diode element including the above preferred configurations and modes, the third compound semiconductor layer may have, but not limited to, a quantum well structure including a well layer and a barrier layer, and the thickness of the well layer is within a range of 1 nm to 10 nm both inclusive, preferably within a range of 1 nm to 8 nm both inclusive, and the doping concentration of an impurity in the barrier layer is within a range of $2\times10^{18}$ cm$^{-3}$ to $1\times10^{20}$ cm$^{-3}$ both inclusive, preferably within a range of $1\times10^{19}$ cm$^{-3}$ to $1\times10^{20}$ cm$^{-3}$ both inclusive.

When the thickness of the well layer constituting the third compound semiconductor layer is determined within a range of 1 nm to 10 nm both inclusive, and the doping concentration of the impurity in the barrier layer constituting the third compound semiconductor layer is determined within a range of $2\times10^{18}$ cm$^{-3}$ to $1\times10^{20}$ cm$^{-3}$ both inclusive, i.e., when the thickness of the well layer is reduced, and carriers of the third compound semiconductor layer are increased, the effect of piezopolarization is allowed to be reduced, and a laser light source capable of generating an unimodel optical pulse of short duration having a smaller number of sub-pulse components is allowed to be obtained. Moreover, mode-locking drive is allowed to be achieved with a lowest possible reverse bias voltage, and an optical pulse train in synchronization with external signals (an electrical signal and an optical signal) is allowed to be generated. The impurity included in the barrier layer may be, but not limited to, silicon (Si), and the impurity may be oxygen (O).

Alternatively, in the multielectrode type laser diode element including the above preferred configurations and modes, it is desirable that the width of the separation groove separating the second electrode into the first section and the second section be 2 μm or more and 40% or less of a resonator length in the multielectrode type laser diode element (hereinafter simply referred to as "resonator length"), preferably 10 μm or more and 20% or less of the resonator length. The resonator length may be 0.6 mm as an example, but is not limited thereto.

The laser diode element in the laser diode element assemblies and the methods of driving the same according to the first to third embodiments of the application including the above-described various preferred configurations and modes (hereinafter may be collectively simply referred to as "laser diode element in the application") may be a laser diode element having a ridge stripe type separate confinement heterostructure (SCH structure). Alternatively, the laser diode element may be a laser diode element having an oblique ridge stripe type separate confinement heterostructure. In the multielectrode type laser diode element, a forward bias state is created by passing a DC current from the first section of the second electrode to the first electrode through the light emission region, and a voltage (a reverse bias voltage) is applied between the first electrode and the second section of the second electrode to apply an electric field to the saturable absorption region, thereby allowing a self-pulsation operation and a mode-locking operation to be performed.

In the laser diode element in the application, the second electrode may be configured of a palladium (Pd) single layer, a nickel (Ni) single layer, a platinum (Pt) single layer, a palladium layer/platinum layer laminate structure in which the platinum layer is in contact with a second compound semiconductor layer, or a palladium layer/nickel layer laminate structure in which the palladium layer is in contact with the second compound semiconductor layer. It is to be noted that, in the case where a lower metal layer is made of palladium, and an upper metal layer is made of nickel, it is desirable that the thickness of the upper metal layer be 0.1 μm or more, preferably 0.2 μm or more. Alternatively, the second electrode is preferably configured of a palladium (Pd) single layer, and in this case, it is desirable that the thickness thereof be 20 nm or more, preferably 50 nm or more. Alternatively, the second electrode is preferably configured of a palladium (Pd) single layer, a nickel (Ni) single layer, a platinum (Pt) single layer, or a laminate structure including a lower metal layer, which is in contact with the second compound semiconductor layer, and an upper metal layer (where the lower metal layer is made of one kind of metal selected from the group consisting of palladium, nickel, and platinum, and the upper metal layer is made of a metal with an etching rate, in the case where the separation groove is formed in the second electrode in a step (D) which will be described later, being equal to, substantially equal to, or higher than the etching rate of the lower metal layer). Moreover, it is desirable that an etchant used to form the separation groove in the second electrode in the step (D) which will be described later be aqua regia, nitric acid, sulfuric acid, hydrochloric acid, or a mixed solution of two or more kinds selected from them (specifically, a mixed solution of nitric acid and sulfuric acid or a mixed solution of sulfuric acid and hydrochloric acid).

In the multielectrode type laser diode element, specific arrangement states of the first section and the second section of the second electrode include:

(1) a state where one first section of the second electrode and one second section of the second electrode are provided, and the first section of the second electrode and the second section of the second electrode are disposed with the separation groove in between;

(2) a state where one first section of the second electrode and two second sections of the second electrode are provided, and an end of the first section faces one of the second sections with one separation groove in between, and the other end of the first section faces the other second section with the other separation groove in between; and (3) a state where two first sections of the second electrode and one second section of the second electrode are provided, and an end of the second section faces one of the first sections with one separation groove in between, and the other end of the second section faces the other first section with the other separation groove in between (that is, the second electrode has a configuration in which the second section is sandwiched between the first sections).

More broadly, the arrangement states include:

(4) a state where N first sections of the second electrode and (N−1) second sections of the second electrode are provided, and the first sections of the second electrode are arranged with the second sections of the second electrode in between; and (5) a state where N second sections of the second electrode and (N−1) first sections of the second electrode are provided, and the second sections of the second electrode are arranged with the first sections of the second electrode in between.

It is to be noted that, in other words, the states (4) and (5) are:

(4') a state where N light emission regions (carrier injection regions, gain regions) and (N−1) saturable absorption regions (carrier non-injection regions) are provided, and the light emission regions are arranged with the saturable absorption regions in between; and (5') a state where N saturable absorption regions (carrier non-injection regions) and (N−1) light emission regions (carrier injection regions, gain regions) are provided, and the saturable absorption regions are arranged with the light emission regions in between, respectively.

Although a method of manufacturing a multielectrode type laser diode element varies depending on the configuration and structure of a multielectrode type laser diode element to be manufactured, the multielectrode type laser diode element is allowed to be manufactured by, for example, the following method. More specifically, the multielectrode type laser diode element is allowed to be manufactured by a method including the following steps of:

(A) forming, on a base, a laminate structure body configured by laminating, in order, a first compound semiconductor layer of a first conductivity type made of a GaN-based compound semiconductor, a third compound semiconductor layer made of a GaN-based compound semiconductor and including a light emission region and a saturable absorption region, and a second compound semiconductor layer of a second conductivity type made of a GaN-based compound semiconductor, the second conductivity type being different from the first conductivity type;

(B) forming a second electrode on the second compound semiconductor layer;

(C) forming a ridge stripe structure by etching a part or a whole of the second compound semiconductor layer with use of the second electrode as an etching mask; and (D) forming a resist layer for forming a separation groove in the second electrode, and then forming the separation groove in the second electrode by a wet-etching method with use of the resist layer as a wet-etching mask, thereby separating the second electrode into the first section and the second section by the separation groove.

Then, when such a manufacturing method is adopted, specifically, when the ridge stripe structure is formed by etching a part or a whole of the second compound semiconductor layer with use of the second electrode as an etching mask, i.e., by a self-alignment system with use of the patterned second electrode as an etching mask, misalignment between the second electrode and the ridge stripe structure does not occur. Moreover, the separation groove is preferably formed in the second electrode by a wet-etching method. Thus, when the wet-etching method is adopted, unlike a dry-etching method, deterioration in optical and electrical characteristics of the second compound semiconductor layer is allowed to be suppressed. Therefore, deterioration in light emission characteristics is allowed to be reliably prevented.

It is to be noted that, depending on the configuration and structure of the multielectrode type laser diode element to be manufactured, in the step (C), the second compound semiconductor layer may be partially etched in a thickness direction, or the second compound semiconductor layer may be entirely etched in the thickness direction, or the second compound semiconductor layer and the third compound semiconductor layer may be etched in the thickness direction, or the second compound semiconductor layer and the third compound semiconductor layer, and further the first compound semiconductor layer may be partially etched in the thickness direction.

Moreover, in the step (D), it is desirable to satisfy $ER_0/ER_1 \geq 1 \times 10$, preferably $ER_0/ER_1 \geq 1 \times 10^2$, where the etching rate of the second electrode and the etching rate of the laminate structure body in the case where the separation groove is formed in the second electrode are $ER_0$ and $ER_1$, respectively. When $ER_0/ER_1$ satisfies such a relationship, the second electrode is allowed to be reliably etched without etching the laminate structure body (or with only slightly etching the laminate structure body).

Moreover, in the laser diode element in the application, specifically, the laminate structure body may be made of an AlGaInN-based compound semiconductor. Specific AlGaInN-based compound semiconductors include GaN, AlGaN, GaInN, and AlGaInN. Moreover, these compound semiconductors may include a boron (B) atom, a thallium (Tl) atom, an arsenic (As) atom, a phosphorus (P) atom, or an antimony (Sb) atom at request. Further, it is desirable that the third compound semiconductor layer (active layer) have a quantum well structure. More specifically, the third compound semiconductor layer may have a single quantum well structure (QW structure) or a multiple quantum well structure (MQW structure). The third compound semiconductor layer (active layer) with a quantum well structure has a structure configured by laminating one or more well layers and one or more barrier layers; however, examples of a combination of (a compound semiconductor forming the well layer, a compound semiconductor forming the barrier layer) include $(In_yGa_{(1-y)}N, GaN)$, $(In_yGa_{(1-y)}N, In_zGa_{(1-z)}N)$ (where y>z), and $(In_yGa_{(1-y)}N, AlGaN)$.

Moreover, in the laser diode element in the application, the second compound semiconductor layer may have a superlattice structure in which p-type GaN layers and p-type AlGaN layers are alternately laminated, and the thickness of the superlattice structure may be 0.7 μm or less. When such a superlattice structure is adopted, while a high refractive index necessary as a cladding layer is maintained, a series resistance component of the laser diode element is allowed to be reduced, thereby leading to a reduction in an operation voltage of the laser diode element. It is to be noted that the lower limit of the thickness of the superlattice structure may be, but not limited to, for example, 0.3 μm, and the thickness of the p-type GaN layer constituting the superlattice structure may be within a range of 1 nm to 5 nm, and the thickness of the p-type AlGaN layer constituting the superlattice structure may be within a range of 1 nm to 5 nm, and the total layer number of the p-type GaN layers and the p-type AlGaN layers may be within a range of 60 layers to 300 layers. Further, a distance from the third compound semiconductor layer to the second electrode may be 1 μm or less, preferably 0.6 μm or less. When the distance from the third compound semiconductor layer to the second electrode is determined in such a manner, the thickness of a p-type second compound semiconductor layer with high resistance is allowed to be reduced to achieve a reduction in the operation voltage of the laser diode element. It is to be noted that the lower limit of the distance from the third compound semiconductor layer to the second electrode may be, but not limited to, for example, 0.3 μm. Moreover, the second compound semiconductor layer is doped with $1 \times 10^{19}$ $cm^{-3}$ or more of Mg; and the absorption coefficient of the second compound semiconductor layer with respect to light with a wavelength of 405 nm from the third compound semiconductor layer is 50 $cm^{-1}$ or more. The atomic concentration of Mg is set on the basis of material physical properties in which the maximum hole concentration is exhibited at an atomic concentration of $2 \times 10^{19}$ $cm^{-3}$, and the atomic concentration of Mg is a result of design to achieve a maximum hole concentration, i.e., minimum resistivity of the second compound semiconductor layer. The absorption coefficient of the second compound semiconductor layer is determined to minimize the resistance of the laser diode element, and as a result, the absorption coefficient of light from the third compound semiconductor layer is typically 50 $cm^{-1}$. However, the doping amount of Mg may be intentionally set to a concentration of $2 \times 10^{19}$ $cm^{-3}$ or more to increase the absorption coefficient. In this case, the upper limit of the doping amount of Mg to achieve a practical hole concentration is, for example, $8 \times 10^{19}$ cm$^{-3}$. Further, the second compound semiconductor layer includes an undoped compound semiconductor layer and a p-type compound semiconductor layer in order of increasing distance from the third compound semiconductor layer, and a distance from the third compound semiconductor layer to the p-type compound semiconductor layer may be $1.2 \times 10^{-7}$ m or less. When the distance from the third compound semiconductor layer to the p-type compound semiconductor layer is determined in such a manner, internal loss is allowed to be suppressed without decreasing internal quantum efficiency, thereby allowing threshold current density at which laser oscillation starts to be reduced. It is to be noted that the lower limit of the distance from the third compound semiconductor layer to the p-type compound semiconductor layer may be, but not limited to, for example, $5 \times 10^{-8}$ m. Moreover, a laminated insulating film configured of a SiO$_2$/Si laminate structure is formed on both side surfaces of the ridge stripe structure; and a difference in effective refractive index between the ridge stripe structure and the laminated insulating film may be within a range of $5 \times 10^{-3}$ to $1 \times 10^{-2}$. When such a laminated insulating film is used, a single fundamental transverse mode is allowed to be maintained even in a high-power operation with over 100 milliwatts. Moreover, the second compound semiconductor layer may have, for example, a structure configured by laminating an undoped GaInN layer (p-side light guide layer), an undoped AlGaN layer (p-side cladding layer), a Mg-doped AlGaN layer (electron barrier layer), a GaN layer (Mg-doped)/AlGaN layer superlattice structure (superlattice cladding layer), and a Mg-doped GaN layer (p-side contact layer) in order of increasing distance from the third compound semiconductor layer. It is desirable that the band gap of a compound semiconductor forming the well layer in the third compound semiconductor layer be 2.4 eV or more. Further, it is desirable that the wavelength of laser light emitted from the third compound semiconductor layer (active layer) be within a range of 360 nm to 500 nm, preferably 400 nm to 410 nm. Obviously, the above-described various configurations may be suitably combined.

In the laser diode element in the application, various GaN-based compound semiconductor layers constituting the laser diode element are formed on a substrate in order, and in addition to a sapphire substrate, examples of the substrate include a GaAs substrate, a GaN substrate, a SiC substrate, an alumina substrate, a ZnS substrate, a ZnO substrate, an MN substrate, a LiMgO substrate, a LiGaO$_2$ substrate, a MgAl$_2$O$_4$ substrate, an InP substrate, a Si substrate, and one of these substrates with a surface (a main surface) where a base layer or a buffer layer is formed. In the case where the GaN-based compound semiconductor layer is formed on the substrate, the GaN substrate is typically preferable because of low defect density; however, it is known that the GaN substrate exhibits polarity, nonpolarity, or semipolarity depending on a growth plane. Further, methods of forming various GaN-based compound semiconductor layers constituting the laser diode element include metal organic chemical vapor deposition methods (a MOCVD method, a MOVPE method), a molecular beam epitaxy method (a MBE method), a hydride vapor deposition method in which halogens contribute to transport or reaction, and the like.

Examples of an organic gallium source gas in the MOCVD method include a trimethylgallium (TMG) gas and a triethylgallium (TEG) gas, and examples of a nitrogen source gas include an ammonia gas and a hydrazine gas. To form a GaN-based compound semiconductor layer of an n-type conductivity type, for example, silicon (Si) may be added as an n-type impurity (n-type dopant), and to form a GaN-based compound semiconductor layer of a p-type conductivity type, for example, magnesium (Mg) may be added as a p-type impurity (p-type dopant). When aluminum (Al) or indium (In) is included as a constituent atom of the GaN-based compound semiconductor layer, a trimethylaluminum (TMA) gas may be used as an Al source, and trimethylindium (TMI) gas may be used as an In source. In addition, a monosilane (SiH$_4$) gas may be used as a Si source, and a cyclopentadienylmagnesium gas, methylcyclopentadienylmagnesium, or bis(cyclopentadienyl)magnesium (Cp$_2$Mg) may be used as an Mg source. It is to be noted that, in addition to Si, examples of the n-type impurity (n-type dopant) include Ge, Se, Sn, C, Te, S, O, Pd, and Po, and in addition to Mg, examples of the p-type impurity (p-type dopant) include Zn, Cd, Be, Ca, Ba, C, Hg, and Sr.

When the first conductivity type is of a n-type conductivity type, the first electrode electrically connected to the first compound semiconductor layer of the n-type conductivity type desirably has a single-layer structure or a multilayer structure including one or more kinds of metal selected from the group consisting of gold (Au), silver (Ag), palladium (Pd), aluminum (Al), titanium (Ti), tungsten (W), copper (Cu), zinc (Zn), tin (Sn), and indium (In), and examples of such a multilayer structure may include Ti/Au, Ti/Al, and Ti/Pt/Au. The first electrode is electrically connected to the first compound semiconductor layer, and states where the first electrode is electrically connected to the first compound semiconductor layer include a state where the first electrode is formed on the first compound semiconductor layer, and a state where the first electrode is connected to the first compound semiconductor layer through a conductive material layer or a conductive substrate. The first electrode and the second electrode are allowed to be formed by a PVD method such as a vacuum deposition method or a sputtering method.

A pad electrode may be formed on the first electrode or the second electrode to allow the first electrode or the second electrode to be electrically connected to an external electrode or circuit. It is desirable that the pad electrode have a single-layer structure or a multilayer structure including one or more kinds of metal selected from the group consisting of Ti (titanium), Al (aluminum), Pt (platinum), Au (gold), and Ni (nickel). Alternatively, the pad electrode may have a multilayer structure such as Ti/Pt/Au or Ti/Au.

In multielectrode type laser diode element, as described above, for pulsed oscillation, a configuration in which a reverse bias voltage is applied between the first electrode and the second section of the second electrode (that is, a configuration in which the first electrode and the second section are a cathode and an anode, respectively) is desirable. It is to be noted that a pulse current applied to the first section of the second electrode, a pulse current in synchronization with a pulse voltage, or a pulse voltage may be applied to the second section of the second electrode, or a DC bias may be applied to the second section of the second electrode. Moreover, while a current is passed from the second electrode to the first electrode through the light emission region, an external electrical signal may be applied from the second electrode to the first electrode through the light emission region to be superimposed on the current. Accordingly, laser light and an external electrical signal are allowed to be synchronized. Alternatively, an optical signal is allowed to enter from one end surface of the laminate structure body. Thus, laser light and the optical signal are allowed to be synchronized. Moreover, in the second compound semiconductor layer, an undoped compound semiconductor layer (for example, an undoped GaInN layer or an undoped AlGaN layer) may be formed between the third compound semiconductor layer and an electronic barrier layer. Moreover, an undoped GaInN layer as an optical guide layer may be formed between the third compound semiconductor layer and the undoped compound semiconductor layer. The uppermost layer of the second compound semiconductor layer may be occupied by an Mg-doped GaN layer (p-side contact layer).

The laser diode element in the application is applicable to, for example, fields such as optical disk systems, the communications field, the optical information field, opto-electronic integrated circuits, fields of application of nonlinear optical phenomena, optical switches, various analysis fields such as the laser measurement field, the ultrafast spectroscopy field, the multiphase excitation spectroscopy field, the mass analysis field, the microspectroscopy field using multiphoton absorption, quantum control of chemical reaction, the nano three-dimensional processing field, various processing fields using multiphoton absorption, the medical fields, and the bio-imaging field.

Example 1

Figure 1B:
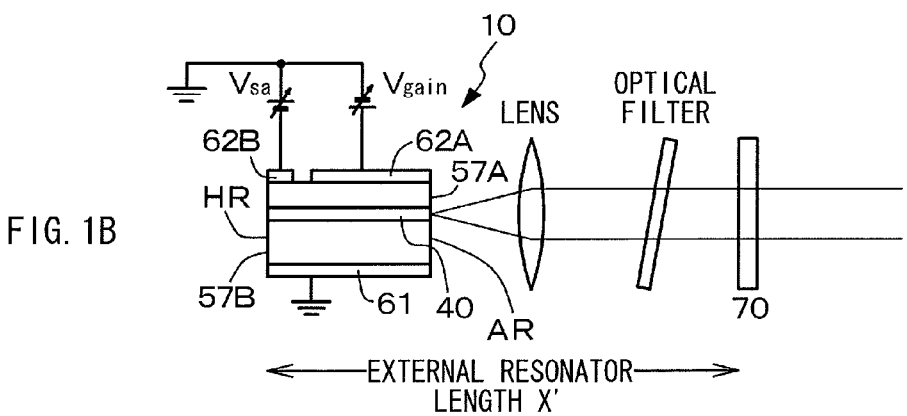
Figure 1C:
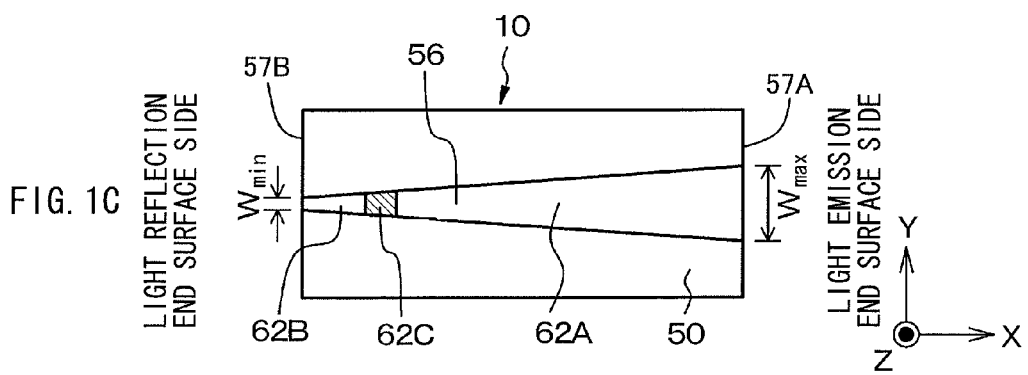
Figure 2A:
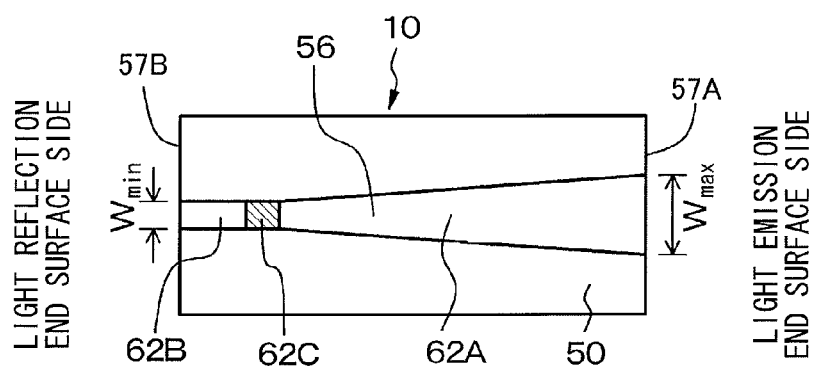
FIGS. 2A and 2B are schematic plan views of modifications of the laser diode element in Example 1 or Example 2.
Figure 2B:
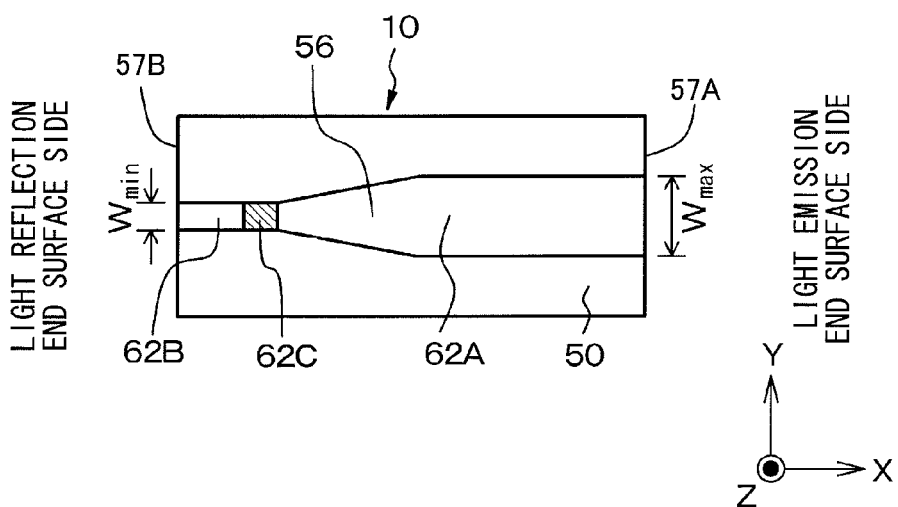
Figure 3:
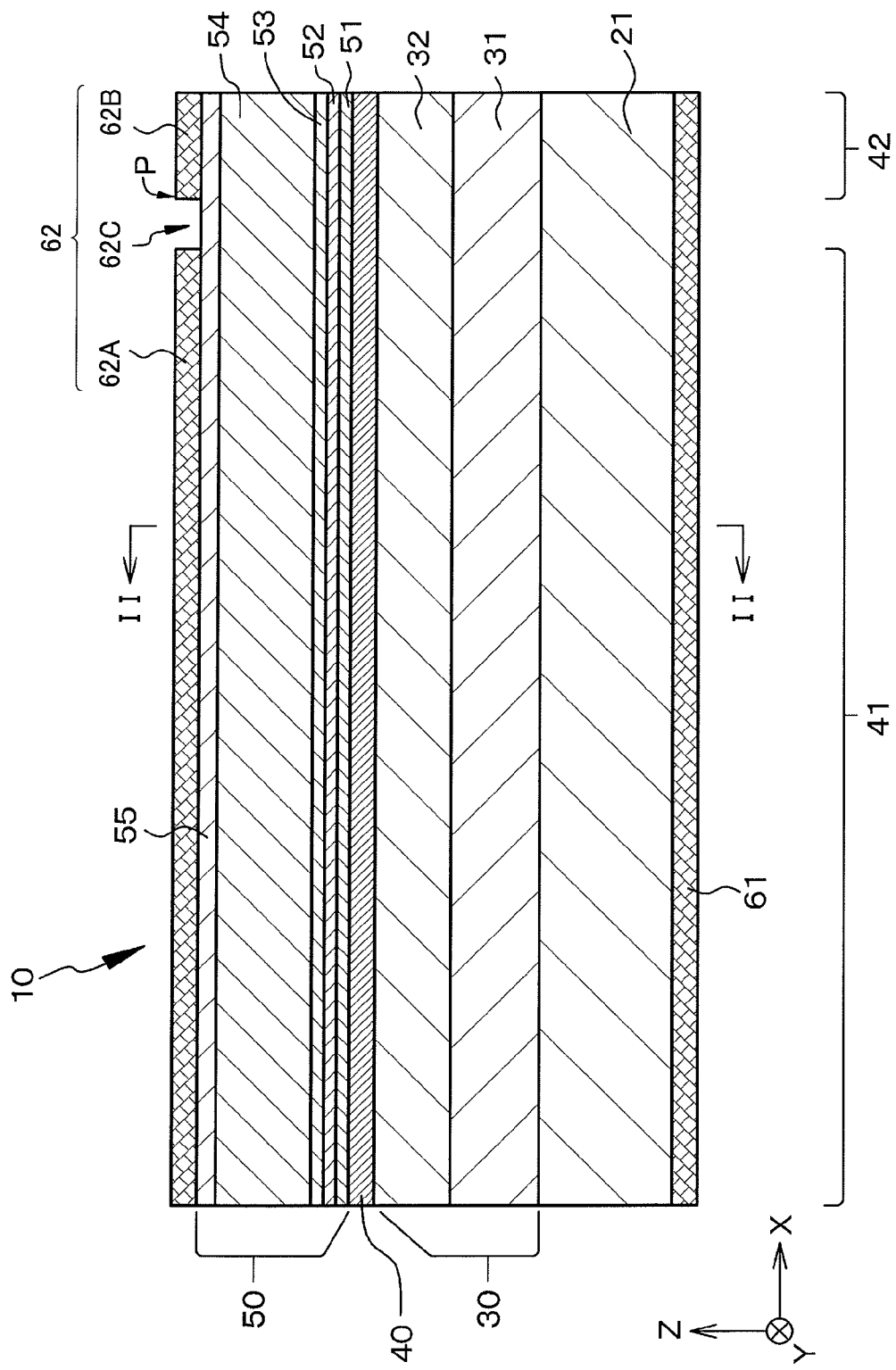
FIG. 3 is a schematic end view of the laser diode element in Example 1 or Example 2 taken along a direction where a resonator extends (a schematic end view taken along a XZ plane).
Figure 4:
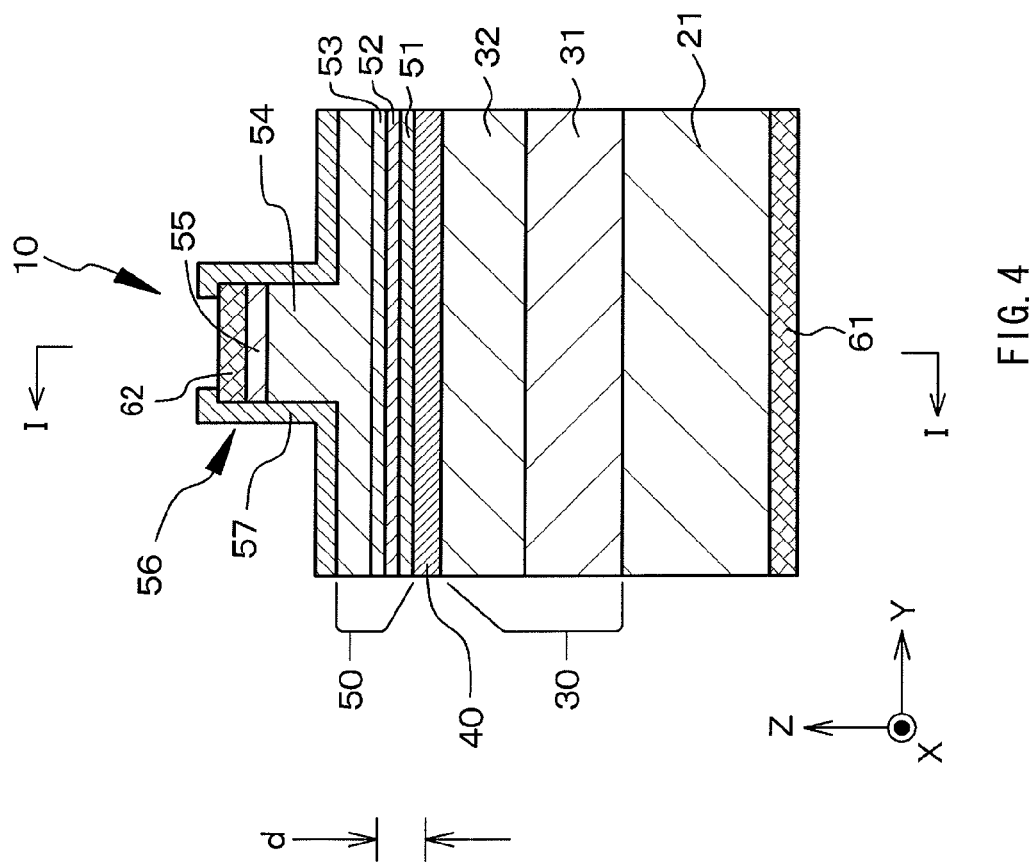
FIG. 4 is a schematic sectional view of the laser diode element in Example 1 or Example 2 taken along a direction perpendicular to the direction where the resonator extends (a schematic sectional view taken along a YZ plane).

Example 1 relates to the laser diode element assemblies according to the first and third embodiments of the application. FIGS. 1A and 1B illustrate conceptual diagrams of a laser diode element assembly of Example 1, and FIGS. 1C, 2A and 2B illustrate schematic plan views of a laser diode element in Example 1. Moreover, FIG. 3 illustrates a schematic end view of the laser diode element in Example 1 taken along a direction where a resonator extends (a schematic end view taken along an XZ plane), and FIG. 4 illustrates a schematic sectional view taken along a direction perpendicular to the direction where the resonator extends (a schematic sectional view taken along a YZ plane). It is to be noted that FIG. 3 is a schematic end view taken along an arrow I-I of FIG. 4, and FIG. 4 is a schematic sectional view taken along an arrow II-II of FIG. 3.

The laser diode element assembly in Example 1 or Example 2 which will be described later (hereinafter may be collectively referred to as "laser diode element assembly of Example 1 or the like") includes a laser diode element 10 and a light reflector 70, and the laser diode element 10 includes:

(a) a laminate structure body configured by laminating, in order, a first compound semiconductor layer 30 of a first conductivity type (specifically, an n-type conductivity type in each example) made of a GaN-based compound semiconductor, a third compound semiconductor layer (active layer) 40 made of a GaN-based compound semiconductor and including a light emission region (gain region) 41, and a second compound semiconductor layer 50 of a second conductivity type (specifically, a p-type conductivity type in each example) made of a GaN-based compound semiconductor, the second conductivity type being different from the first conductivity type;

(b) a second electrode 62 formed on the second compound semiconductor layer 50; and (c) a first electrode 61 electrically connected to the first compound semiconductor layer 30.

Alternatively, the laser diode element assembly of Example 1 or the like includes the laser diode element 10 and an external resonator 70, and the laser diode element 10 includes:

(a) a laminate structure body configured by laminating, in order, the first compound semiconductor layer 30 of a first conductivity type made of a GaN-based compound semiconductor, the third compound semiconductor layer 40 made of a GaN-based compound semiconductor and including the light emission region (gain region) 41, and the second compound semiconductor layer 50 of a second conductivity type made of a GaN-based compound semiconductor, the second conductivity type being different from the first conductivity type;

(b) the second electrode 62 formed on the second compound semiconductor layer 50; and (c) the first electrode 61 electrically connected to the first compound semiconductor layer 30.

Specifically, the laser diode element 10 of Example 1 or the like is configured of a multielectrode type laser diode element (more specifically, a bisection type laser diode element), and the third compound semiconductor layer (active layer) 40 further includes a saturable absorption region 42, and the second electrode 62 is configured of a first section 62A and a second section 62B, the first section 62A configured to create a forward bias state by passing a current to the first electrode 61 through the light emission region 41, the second section 62B configured to apply an electric field to the saturable absorption region 42, and the first section 62A and the second section 62B of the second electrode 62 are separated by a separation groove 62C.

The laminate structure body includes a ridge stripe structure 56. Specifically, the laser diode element 10 of Example 1 or the like is a laser diode element having a ridge stripe type separate confinement heterostructure (SCH structure). More specifically, the laser diode element is a GaN-based laser diode element made of index guide type AlGaInN developed for Blu-ray optical disk systems. Specifically, the first compound semiconductor layer 30, the third compound semiconductor layer 40, and the second compound semiconductor layer 50 are made of an AlGaInN-based compound semiconductor, and more specifically, in the laser diode element 10 of Example 1 or the like, they have layer structures illustrated in the following Table 1. In this case, compound semiconductor layers in Table 1 are listed in order of decreasing distance from an n-type GaN substrate 21. In addition, the band gap of a compound semiconductor forming a well layer in the third compound semiconductor layer 40 is 3.06 eV. The laser diode element 10 of Example 1 or the like is disposed on a (0001) plane of the n-type GaN substrate 21, and the third compound semiconductor layer 40 has a quantum well structure. The (0001) plane of the n-type GaN substrate 21 is also called "C plane", and is a crystal plane having polarity.

TABLE 1

Second compound semiconductor layer 50
   p-type GaN contact layer (Mg-doped) 55
   p-type GaN (Mg-doped)/AlGaN superlattice cladding layer 54
   p-type AlGaN electron barrier layer (Mg-doped) 53
   Undoped AlGaN cladding layer 52
   Undoped GaInN light guide layer 51
Third compound semiconductor layer 40
   GaInN quantum well active layer
     (Well layer: $Ga_{0.92}In_{0.08}N$/barrier layer: $Ga_{0.98}In_{0.02}N$)
First compound semiconductor layer 30
   n-type GaN cladding layer 32
   n-type AlGaN cladding layer 31
Herein,

| | | |
|---|---|---|
| Well layer (two layers) | 10.5 nm | undoped |
| Barrier layer (three layers) | 14 nm | undoped |

Moreover, a part of the p-type GaN contact layer 55 and a part of the p-type GaN/AlGaN superlattice cladding layer 54 are removed by an RIE method to form the ridge stripe structure 56. A laminated insulating film 57 made of $SiO_2$/Si is formed on both sides of the ridge stripe structure 56. It is to be noted that the $SiO_2$ layer is a lower layer, and the Si layer is an upper layer. In this case, a difference in effective refractive index between the ridge stripe structure 56 and the laminated insulating film 57 is within a range from $5\times10^{-3}$ to $1\times10^{-2}$ both inclusive, more specifically $7\times10^{-3}$. The second electrode (p-side ohmic electrode) 62 is formed on the p-type GaN contact layer 55 corresponding to a top surface of the ridge stripe structure 56. On the other hand, the first electrode (n-side ohmic electrode) 61 made of Ti/Pt/Au is formed on a back surface of the n-type GaN substrate 21.

In the laser diode element of Example 1 or the like, the p-type AlGaN electronic barrier layer 53, the p-type GaN/AlGaN superlattice cladding layer 54, and the p-type GaN contact layer 55, which are Mg-doped compound semiconductor layers, overlap a light density distribution generated from the third compound semiconductor layer 40 and its surroundings as little as possible, thereby reducing internal loss without reducing internal quantum efficiency. As a result, threshold current density at which laser oscillation starts is reduced. More specifically, a distance d from the third compound semiconductor layer 40 to the p-type AlGaN electronic barrier layer 53 is 0.10 μm, the height of the ridge stripe structure 56 is 0.30 μm, the thickness of the second compound semiconductor layer 50 disposed between the second electrode 62 and the third compound semiconductor layer 40 is 0.50 μm, and the thickness of a portion disposed below the second electrode 62 of the p-type GaN/AlGaN superlattice cladding layer 54 is 0.40 μm.

In the laser diode element 10 of Example 1 or the like, the second electrode 62 is separated by the separation groove 62C into the first section 62A and the second section 62B, the first section 62A configured to create a forward bias state by passing a DC current to the first electrode 61 through the light emission region (gain region) 41, the second section 62B configured to apply an electric field to the saturable absorption region 42 (the second section 62B configured to apply a reverse bias voltage to the saturable absorption region 42 in pulsed oscillation). Herein, electrical resistance (may be referred to as a "separation resistance") between the first section 62A and the second section 62B of the second electrode 62 is $1\times10$ times or more, specifically $1.5\times10^3$ times as high as electrical resistance between the second electrode 62 and the first electrode 61. The electrical resistance (separation resistance) between the first section 62A and the second section 62B of the second electrode 62 is $1\times10^2 \Omega$ or more, specifically $1.5\times10^4 \Omega$.

The laser diode element assembly of Example 1 illustrated in the conceptual diagram in FIG. 1A has a condensing type external resonator structure. Moreover, a modification of the laser diode element assembly of Example 1 illustrated in the conceptual diagram in FIG. 1B has a collimating type external resonator structure. Then, the external resonator structure is configured of an end surface (the other end surface 57B) where a high-reflective coating layer (HR) is formed closer to the saturable absorption region 42 of the laser diode element and the light reflector (external resonator) 70, and an optical pulse is extracted from the light reflector (external resonator) 70. An antireflective coating layer (AR) is formed on one end surface (the light emission end surface) 57A closer to the light emission region (gain region) 41 of the laser diode element. As an optical filter, mainly a bandpass filter (for example, with a central wavelength of 410 nm, a light transmittance of 90% or more, and a band of 0.8 nm) is used, and the optical filter is inserted to control the oscillation wavelength of a laser. As will be described later, mode-locking is determined by a DC current applied to the light emission region and the reverse bias voltage applied to the saturable absorption region. The recurrence frequency f of an optical pulse train is determined by an external resonator length X', and is represented by the following formula. Herein, c is the speed of light, and n is a refractive index of a waveguide.

$$f=c/(2n\cdot X')$$

Thus, in the laser diode element assembly of Example 1, laser light is emitted from the one end surface 57A of the ridge stripe structure 56, and a part of the laser light is reflected by the light reflector 70 to be returned to the laser diode element 10, and a remaining part of the laser light exits to outside through the light reflector 70. Moreover, laser light is reflected by the other end surface 57B of the ridge stripe structure 56. Alternatively, laser light is emitted from the one end surface 57A of the ridge stripe structure 56, and the laser light is reflected by the external resonator 70 to be returned to the laser diode element 10, and laser light emitted from the one end surface 57A or the other end surface 57B (specifically, from the one end surface 57A in Example 1) of the ridge stripe structure 56 exits to outside. Then, the minimum width $W_{min}$ and a maximum width $W_{max}$ of the ridge stripe structure 56 satisfy $1<W_{max}/W_{min}<3.3(=10/3)$ or $6 \leq W_{max}/W_{min} \leq 13.3(=40/3)$, and laser light exiting to outside is single-mode light.

More specifically, in the laser diode element in Example 1, laser light is emitted from the one end surface (light emission end surface) 57A closer to the light emission region of the laminate structure body. For example, an antireflective coating layer (AR) or a low-reflective coating layer with a reflectivity of 0.5% or less, preferably 0.3% or less is formed on the one end surface (the light emission end surface) 57A. Moreover, a high-reflective coating layer (HR) with a reflectivity of 85% or more, preferably 95% or more is formed on the other end surface (light reflection end surface) 57B facing the one end surface (light emission end surface) 57A in the laser diode element 10. It is to be noted that the antireflective coating layer (AR), the low-reflective coating layer, and the high-reflective coating layer (HR) are not illustrated. The saturable absorption region 42 is disposed in a portion of the laminate structure body, the portion located closer to an end surface (the other end surface 57B in Example 1) opposite to an end surface (the one end surface 57A in Example 1) where laser light exits to outside. As the antireflective coating layer or the low-reflective coating layer, a laminate structure including two or more kinds of layers selected from the group consisting of a titanium oxide layer, a tantalum oxide layer, a zirconia oxide layer, a silicon oxide layer, and an aluminum oxide layer may be used.

In Example 1, the light reflector 70 or the external resonator 70 is configured of a half mirror.

As described above, it is desirable that the second electrode 62 having separation resistance of $1\times10^2 \Omega$ or more be formed on the second compound semiconductor layer 50. In the case of the GaN-based laser diode element, unlike a GaAs-based laser diode element in related art, mobility in a p-type conductivity type compound semiconductor is small; therefore, without increasing resistance by performing ion implantation or the like on the second compound semiconductor layer 50 of the p-type conductivity type, the second electrode 62 formed on the second compound semiconductor layer 50 of the p-type conductivity type is separated by the separation groove 62C, thereby allowing electrical resistance between the first section 62A and the second section 62B of the second electrode 62 to be 10 or more times as high as electrical resistance between the second electrode 62 and the first electrode 61, or allowing the electrical resistance between the first section 62A and the second section 62B of the second electrode 62 to be $1\times10^2 \Omega$ or more.

In the laser diode element 10 illustrated in the schematic plan view in FIG. 1C, the width on the one end surface (light emission end surface) 57A of the ridge stripe structure 56 is the maximum width $W_{max}$, and the width on the other end surface (light reflection end surface) 57B of the ridge stripe structure 56 is the minimum width $W_{min}$. The width of the ridge stripe structure 56 having a so-called flare structure is gradually and linearly reduced from the one end surface 57A to the other end surface 57B. It is to be noted that, in FIGS. 1C, 2A, 2B, 14, 18A, and 18B, a separation groove region is diagonally shaded to specify the separation groove 62C.

In the laser diode element 10 illustrated in a schematic plan view in FIG. 2A, the width of a portion, corresponding to the first section 62A of the second electrode 62, of the ridge stripe structure 56 is the maximum width $W_{max}$ at the one end surface (light emission end surface) 57A and the minimum width $W_{min}$ at a side facing the separation groove 62C, that is, the width of the portion of the ridge stripe structure 56 is gradually and linearly reduced from the maximum width $W_{max}$ to the minimum width $W_{min}$. The width of a portion, corresponding to the second section 62B of the second electrode 62, of the ridge stripe structure 56 is fixed at the minimum width $W_{min}$.

In the laser diode element 10 illustrated in a schematic plan view in FIG. 2B, the width of a portion, corresponding to the first section 62A of the second electrode 62, of the ridge stripe structure 56 is the maximum width $W_{max}$ in a certain region from the one end surface (light emission end surface) 57A, and the minimum width $W_{min}$ at a side facing the separation groove 62C, that is, the width of the portion of the ridge stripe structure 56 is gradually and linearly reduced to the minimum width $W_{min}$ from the certain region (with the maximum width $W_{max}$). The width of a portion, corresponding to the second section 62B, of the second electrode 62 of the ridge stripe structure 56 is fixed at the minimum width $W_{min}$.

However, the planar shapes of the first section 62A and the second section 62B of the second electrode 62 are not limited to the examples illustrated in FIGS. 1C, 2A, and 2B.

The ridge stripe structure 56 has a so-called flare structure, and the minimum width $W_{min}$ of the ridge stripe structure 56 satisfies $1 \times 10^{-6}$ m $\leq W_{min} \leq 3 \times 10^{-6}$ m.

As the laser diode element illustrated in FIG. 2A, laser diode elements in which the resonator length of the laser diode element 10 was 600 μm, and lengths of the first section 62A, the second section 62B, and the separation groove 62C of the second electrode 62 were 560 μm, 30 μm, and 10 μm, respectively, $W_{min}$ was 1.5 μm, and $W_{max}$ was changed to values indicated in the following Table 2 were prototyped.

TABLE 2

|  | $W_{max}$ (μm) | $W_{max}/W_{min}$ |
| --- | --- | --- |
| Example 1A | 2.5 | 1.7 |
| Reference Example 1B | 5.0 | 3.3 |
| Example 1C | 10.0 | 6.7 |
| Example 1D | 15.0 | 10.0 |
| Example 1E | 20.0 | 13.3 |

Likewise, as the laser diode element illustrated in FIG. 2A, a laser diode element (Example 1F) in which the resonator length of the laser diode element 10 was 600 μm, the lengths of the first section 62A, the second section 62B, and the separation groove 62C of the second electrode 62 were 560 μm, 30 μm, and 10 μm, $W_{min}$ was 2.5 μm, and $W_{max}$ was 15.0 μm ($W_{min}/W_{max}$=6.0) was prototyped.

While a current $I_g$ is passed to the first electrode 61 through the first section 62A of the second electrode 62 and the light emission region 41, a current is passed to the second section 62B of the second electrode 62 through the first electrode 61 and the saturable absorption region 42 (specifically, a reverse bias voltage is applied between the second section 62B of the second electrode 62 and the first electrode 61), thereby allowing single-mode pulsed oscillation to be performed. Moreover, while the current $I_g$ is passed to the first electrode 61 through the first section 62A of the second electrode 62 and the light emission region 41, a current is passed to the first electrode 61 through the second section 62B of the second electrode 62 and the light emission region 41 (specifically, a forward bias voltage is applied between the second section 26B of the second electrode 62 and the first electrode 61), or a current is not passed to the first electrode 61 through the second section 62B of the second electrode 62 and the light emission region 41, thereby allowing single-mode continuous-wave oscillation to be performed. It is to be noted that applying a reverse bias voltage means that the second section 62B of the second electrode 62 and the first electrode 61 are an anode and a cathode, respectively, and a potential difference is $V_{sa}$ ($V_{sa}$<0 with reference to the potential of the second section 62B of the second electrode 62), and applying a forward bias voltage means that the second section 62B of the second electrode 62 and the first electrode 61 are a cathode and an anode, respectively, and the potential difference is $V_{sa}$ ($V_{sa}$>0 with reference to the potential of the first electrode 61).

Figure 6A:
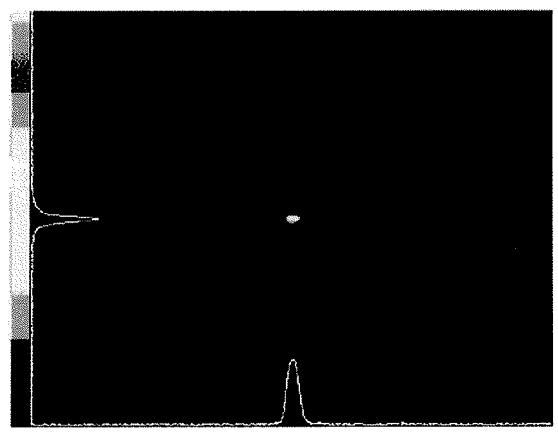
FIGS. 6A and 6B are diagrams illustrating near-field images in pulsed oscillation and a near-field image in continuous-wave oscillation in the case of $(W_{min}, W_{max})=(1.5$ μm, 2.5 μm) (Example 1A), respectively.
Figure 6B:
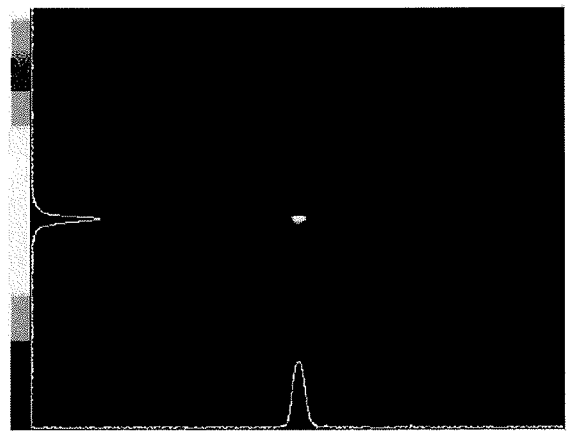
Figure 7A:
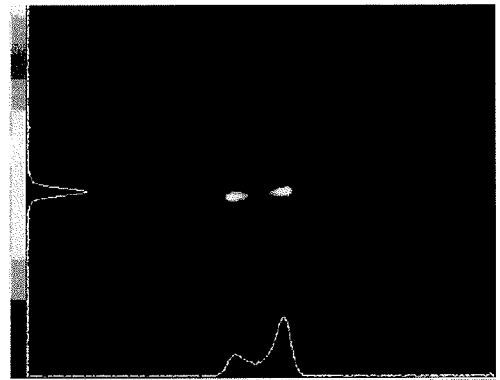
FIGS. 7A to 7C are diagrams illustrating a near-field image in pulsed oscillation and a near-field image in continuous-wave oscillation in the case of $(W_{min}, W_{max})=(1.5$ μm, 5.0 μm) (Reference Example 1B), and a near-field image in Comparative Example 1B, respectively.
Figure 7B:
Figure 7C:
Figure 8A:
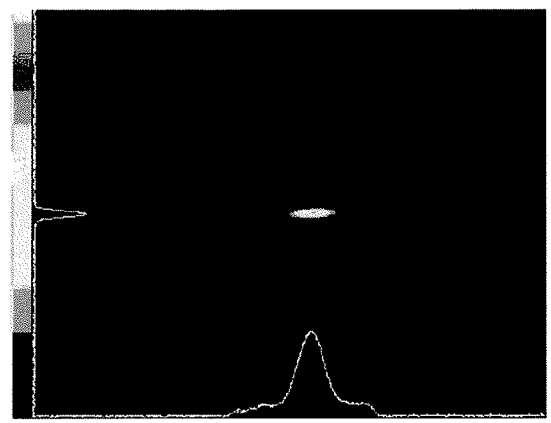
FIGS. 8A to 8C are diagrams illustrating a near-field image in pulsed oscillation and a near-field image in continuous-wave oscillation in the case of $(W_{min}, W_{max})=(1.5$ μm, 10.0 μm) (Example 1C), and a near-field image in Comparative Example 1C, respectively.
Figure 8B:
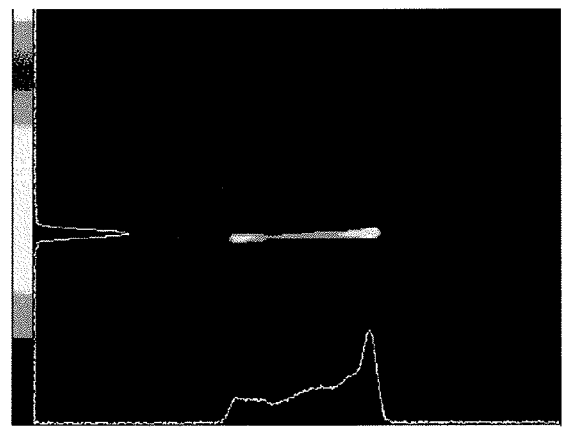
Figure 8C:
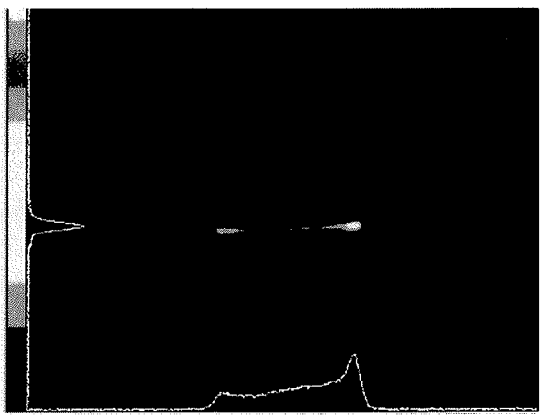
Figure 9A:
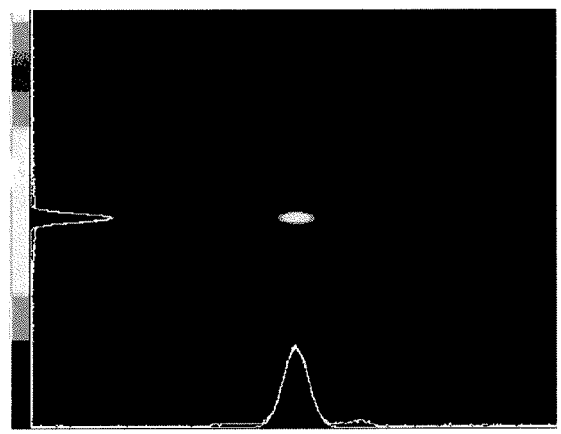
FIGS. 9A to 9C are diagrams illustrating a near-field image in pulsed oscillation and a near-field image in continuous-wave oscillation in the case of $(W_{min}, W_{max})=(1.5$ μm, 15.0 μm) (Example 1D), and a near-field image in Comparative Example 1D, respectively.
Figure 9B:
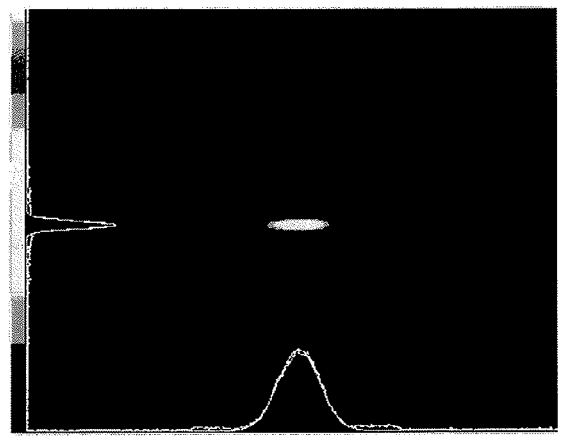
Figure 9C:
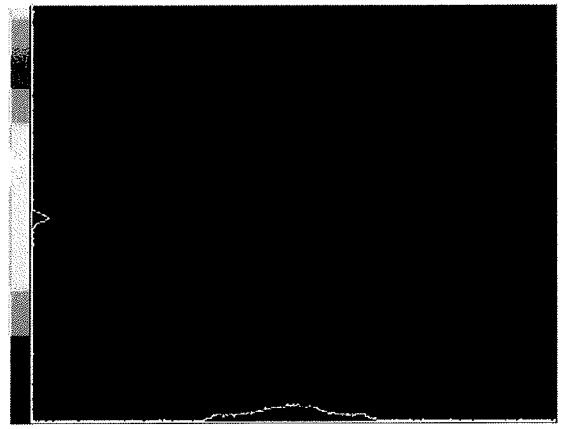
Figure 10A:
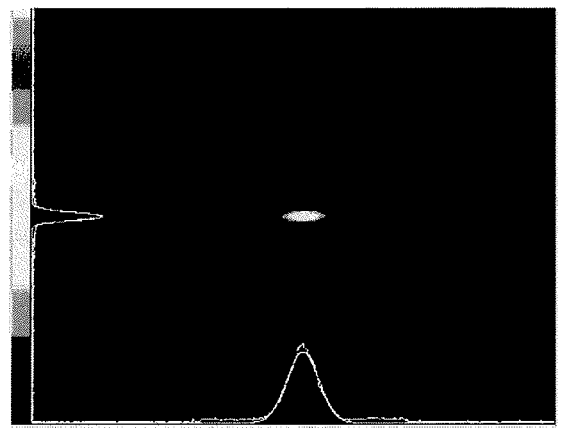
FIGS. 10A to 10C are diagrams illustrating a near-field image in pulsed oscillation and a near-field image in continuous-wave oscillation in the case of $(W_{min}, W_{max})=(1.5$ μm, 20.0 μm) (Example 1E), and a near-field image in Comparative Example 1E, respectively.
Figure 10B:
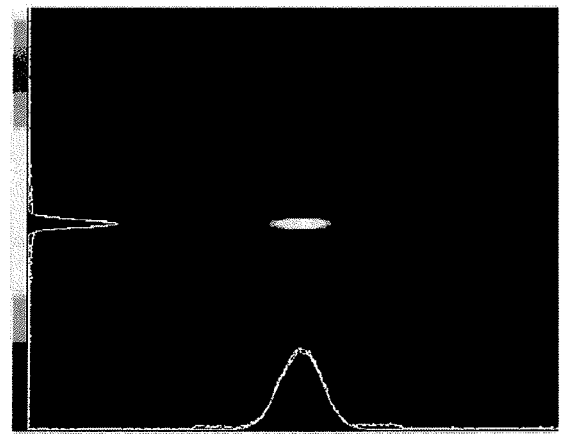
Figure 10C:
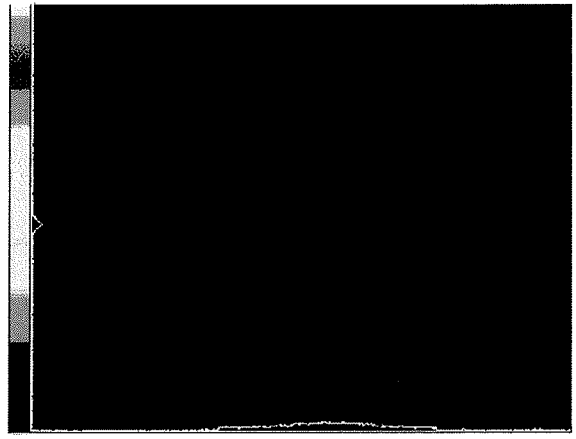
Figure 11A:
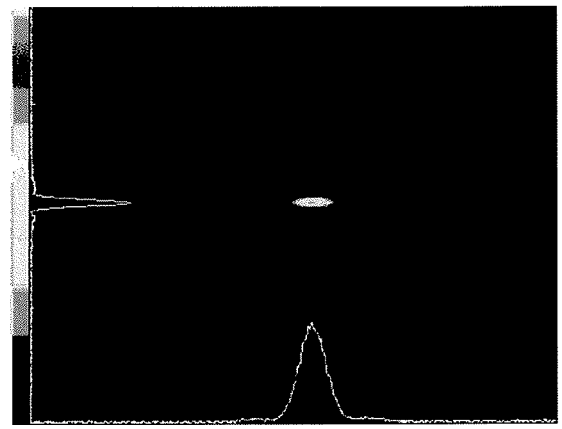
FIGS. 11A to 11C are diagrams illustrating a near-field image in pulsed oscillation and a near-field image in continuous-wave oscillation in the case of $(W_{min}, W_{max})=(2.5$ μm, 15.0 μm) (Example 1F), and a near-field image in Comparative Example 1F, respectively.
Figure 11B:
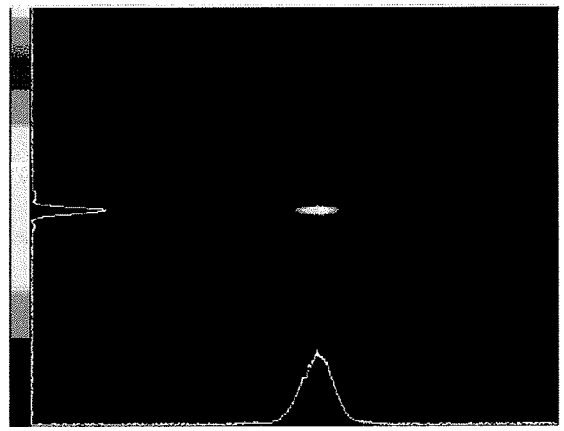
Figure 11C:
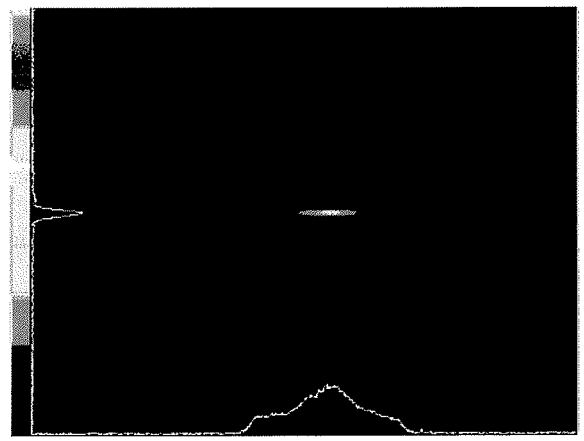

As illustrated in Table 3, oscillation states and oscillation modes of respective samples when the current $I_g$ was passed to the samples, and the voltage $V_{sa}$ was applied to the samples were evaluated. While the results are illustrated in Table 3, near-field images in Example 1A in the case of ($W_{min}$, $W_{max}$)=(1.5 μm, 2.5 μm) are illustrated in FIGS. 6A and 6B, near-field images in Reference Example 1B and Comparative Example 1B in the case of ($W_{min}$, $W_{max}$)=(1.5 μm, 5.0 μm) are illustrated in FIGS. 7A to 7C, near-field images in Example 1C and Comparative Example 1C in the case of ($W_{min}$, $W_{max}$)=(1.5 μm, 10.0 μm) are illustrated in FIGS. 8A to 8C, near-field images in Example 1D and Comparative Example 1D in the case of ($W_{min}$, $W_{max}$)=(1.5 μm, 15.0 μm) are illustrated in FIGS. 9A to 9C, near-field images in Example 1E and Comparative Example 1E in the case of ($W_{min}$, $W_{max}$)= (1.5 μm, 20.0 μm) are illustrated in FIGS. 10A to 10C, and near-field images in Example 1F and Comparative Example 1F in the case of ($W_{min}$, $W_{max}$)=(2.5 μm, 15.0 μm) are illustrated in FIGS. 11A to 11C. It is to be noted that Comparative Example 1B, Comparative Example 1C, Comparative Example 1D, Comparative Example 1E, and Comparative Example 1F correspond to laser diode element assemblies of Reference Example 1B, Example 1C, Example 1D, Example 1E, and Example 1F, respectively, from which the light reflector 70 or the external resonator 70 is removed.

TABLE 3

| $X_{max}$ | | $I_g$ (mA) | $V_{sa}$ (V) | Oscillation State | Mode | Reference Drawing |
| --- | --- | --- | --- | --- | --- | --- |
| $X_{min}$ = 1.5 μm | | | | | | |
| 2.5 μm | Example 1A | 145 | −15 | Pulsed | Single | FIG. 6A |
| | | 45 | +4 | Continuous-wave | Single | FIG. 6B |
| 5.0 μm | Reference Example 1B | 170 | −7 | Pulsed | Multi | FIG. 7A |
| | | 100 | +4 | Continuous-wave | Multi | FIG. 7B |
| | Comparative Example 1B | 100 | +4 | Continuous-wave | Multi | FIG. 7C |

TABLE 3-continued

| $X_{max}$ | | $I_g$ (mA) | $V_{sa}$ (V) | Oscillation State | Mode | Reference Drawing |
|---|---|---|---|---|---|---|
| 10.0 μm | Example 1C | 360 | −7 | Pulsed | Single | FIG. 8A |
| | | 180 | +4 | Continuous-wave | Multi | FIG. 8B |
| | Comparative Example 1C | 180 | +4 | Continuous-wave | Multi | FIG. 8C |
| 15.0 μm | Example 1D | 265 | −9 | Pulsed | Single | FIG. 9A |
| | | 185 | +4 | Continuous-wave | Single | FIG. 9B |
| | Comparative Example 1D | 185 | +4 | Continuous-wave | Multi | FIG. 9C |
| 20.0 μm | Example 1E | 285 | −9 | Pulsed | Single | FIG. 10A |
| | | 200 | +4 | Continuous-wave | Single | FIG. 10B |
| | Comparative Example 1E | 200 | +4 | Continuous-wave | Multi | FIG. 10C |
| | | $X_{min}$ = 2.5 μm | | | | |
| 15.0 μm | Example 1F | 290 | −9 | Pulsed | Single | FIG. 11A |
| | | 190 | +4 | Continuous-wave | Single | FIG. 11B |
| | Comparative Example 1F | 190 | +4 | Continuous-wave | Multi | FIG. 11C |

Herein, in the case of $1 < W_{max}/W_{min} < 3.3$, that is, in Example 1A with $W_{max}/W_{min} = 5/3$, single-mode pulsed oscillation and single-mode continuous-wave oscillation were obtained.

Moreover, in the case of $3.3 \leq W_{max}/W_{min} < 6$, that is, in Reference Example 1B and Comparative Example 1B with $W_{max}/W_{min} = 10/3$, in pulsed oscillation or continuous-wave oscillation, single-mode oscillation was not obtained, but multi-mode oscillation was obtained.

Further, in the case of $6 \leq W_{max}/W_{min} \leq 13.3$, that is, in Example 1C with $W_{max}/W_{min} = 20/3$, in pulsed oscillation, single-mode oscillation was obtained, but in continuous-wave oscillation, multi-mode oscillation was obtained, and in Example 1D with $W_{max}/W_{min} 30/3$, and Example 1E with $W_{max}/W_{min} = 40/3$, in pulsed oscillation, single-mode oscillation was obtained, and in continuous-wave oscillation, single-mode oscillation was also obtained. On the other hand, in Comparative Examples 1C, 1D, and 1E, single-mode oscillation was not obtained, but multi-mode oscillation was obtained.

Moreover, in Example 1F with $W_{max}/W_{min} = 15.0$ μm/2.5 μm=6.0, in pulsed oscillation, single-mode oscillation was obtained, and in continuous-wave oscillation, single-mode oscillation was also obtained. On the other hand, in Comparative Example 1F, single-mode oscillation was not obtained, but multi-mode oscillation was obtained.

Figure 12:
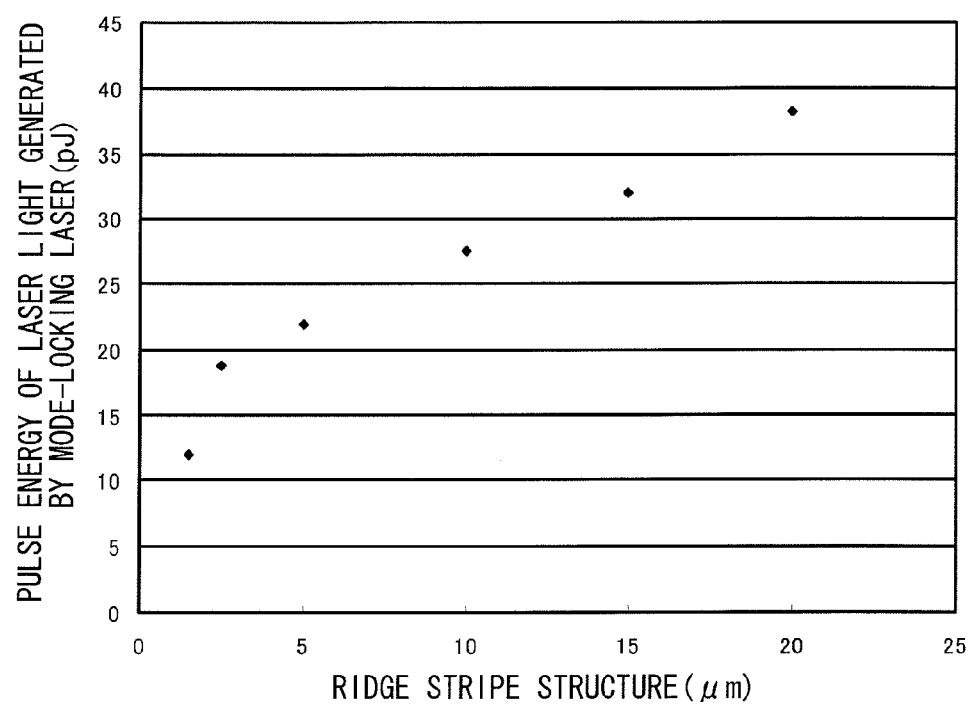
FIG. 12 is a graph illustrating a relationship in the laser diode element assembly of Example 1 between a width of a ridge stripe structure and pulse energy of laser light emitted from the laser diode element assembly in pulsed oscillation.

Further, a laser diode element assembly with $W_{min} = W_{max}$ was formed as Comparative Example 1. When, a relative value $E_{out}/E_0$ of light intensity $E_{out}$ of laser light emitted from the laser diode element assembly was determined where light intensity of laser light exiting to outside in the laser diode element assembly of Comparative Example 1 is $E_0$, the following results were obtained. It is to be noted that FIG. 12 illustrates a relationship between the width of the ridge stripe structure 56 and pulse energy of laser light emitted from the laser diode element assembly in pulsed oscillation, and the larger the value of $W_{max}$ is, the more the area of a gain section increased, thereby increasing the pulse energy of laser light.

| | $E_{out}/E_0$ (pulsed oscillation) | $E_{out}/E_0$ (continuous-wave oscillation) |
|---|---|---|
| Example 1A | 1.6 | 1.5 |
| Example 1C | 2.3 | |
| Example 1D | 2.6 | 5.5 |
| Example 1E | 3.2 | 7.2 |
| Example 1F | 4.3 | 5.8 |

Thus, in the laser diode element assembly of Example 1 or the method of driving the same, an external resonator structure and the ridge stripe structure 56 having a so-called flare structure with a specified relationship between the minimum width $W_{min}$ and the maximum width $W_{max}$ are included; therefore, higher power is allowed to be achieved, and single-mode laser light is allowed to be emitted.

Characteristics which may be necessary for the second electrode 62 are as follows.

(1) The second electrode 62 functions as an etching mask when the second compound semiconductor layer 50 is etched.

(2) The second electrode 62 is allowed to be wet-etched without deteriorating optical and electrical characteristics of the second compound semiconductor layer 50.

(3) The second electrode 62 has contact resistivity of $10^{-2}$ Ω·cm$^2$ or less when the second electrode 62 is formed on the second compound semiconductor layer 50.

(4) When the second electrode 62 has a laminate structure, a material forming a lower metal layer has a large work function, and low contact resistivity with respect to the second compound semiconductor layer 50, and is allowed to be wet-etched.

(5) When the second electrode 62 has a laminate structure, a material forming an upper metal layer has resistance to etching (for example, a Cl$_2$ gas used in a RIE method) performed when a ridge stripe structure is formed, and is allowed to be wet-etched.

In the laser diode element in Example 1 or the like, the second electrode 62 is configured of a Pd single layer with a thickness of 0.1 μm.

It is to be noted that the p-type GaN/AlGaN superlattice cladding layer 54 having a superlattice structure in which p-type GaN layers and p-type AlGaN layers are alternately laminated has a thickness of 0.7 μm or less, more specifically 0.4 μm, and the p-type GaN layer constituting the superlattice structure has a thickness of 2.5 nm, and the p-type AlGaN layer constituting the superlattice structure has a thickness of 2.5 nm, and the total layer number of the p-type GaN layers and the p-type AlGaN layers is 160. Moreover, a distance from the third compound semiconductor layer 40 to the second electrode 62 is 1 μm or less, more specifically 0.5 μm. Further, the p-type AlGaN electronic barrier layer 53, the p-type GaN/AlGaN superlattice cladding layer 54, and the p-type GaN contact layer 55 constituting the second compound semiconductor layer 50 are doped with 1×10$^{19}$ cm$^{-3}$ or more (more specifically, 2×10$^{19}$ cm$^{-3}$) of Mg, and the absorption coefficient of the second compound semiconductor layer 50 with respect to light with a wavelength of 405 nm is 50 cm$^{-1}$ or more, more specifically 65 cm$^{-1}$. Moreover, the second compound semiconductor layer 50 includes, in order of increasing distance from the third compound semiconductor layer 40, undoped compound semiconductor layers (the undoped GaInN light guide layer 51 and the undoped AlGaN cladding layer 52) and p-type compound semiconductor layers, and a distance (d) from the third compound semiconductor layer 40 to the p-type compound semiconductor layers (specifically, the p-type AlGaN electron barrier layer 53) is $1.2 \times 10^{-7}$ m or less, specifically 100 nm.

Figure 16A:
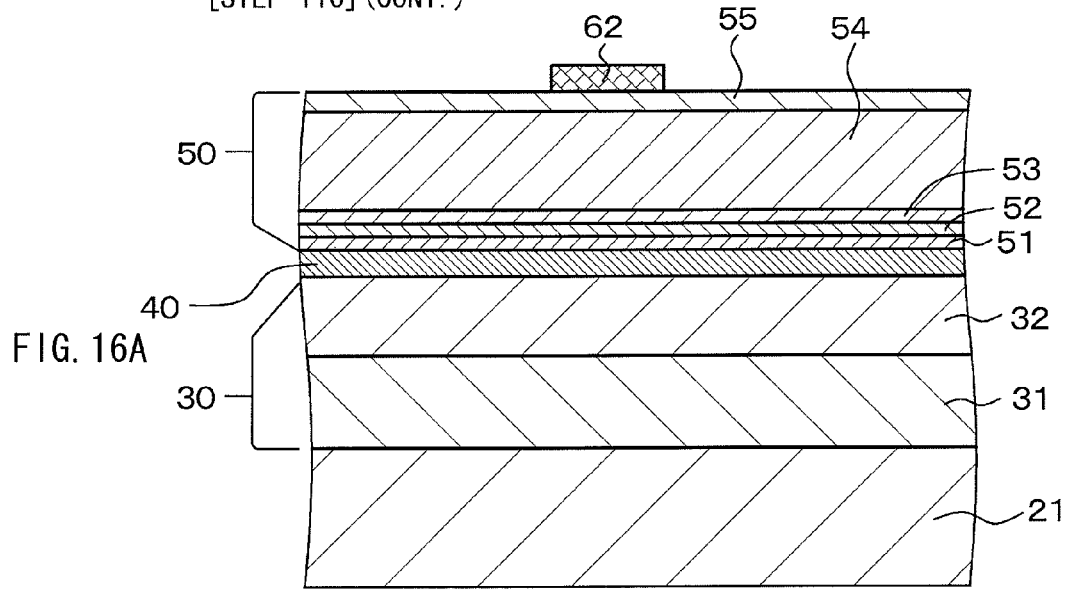
FIGS. 16A and 16B are schematic partial sectional views of the substrate and the like for describing the method of manufacturing the laser diode element in Example 1 following FIG. 15B.
Figure 16B:
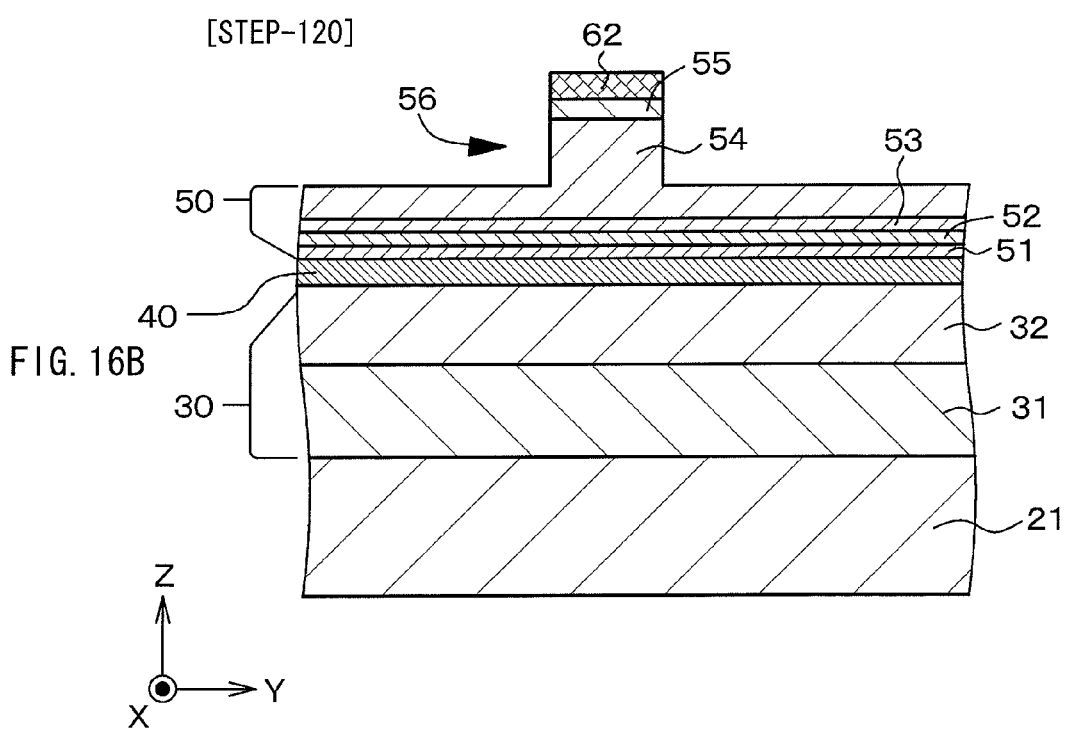
Figure 17:
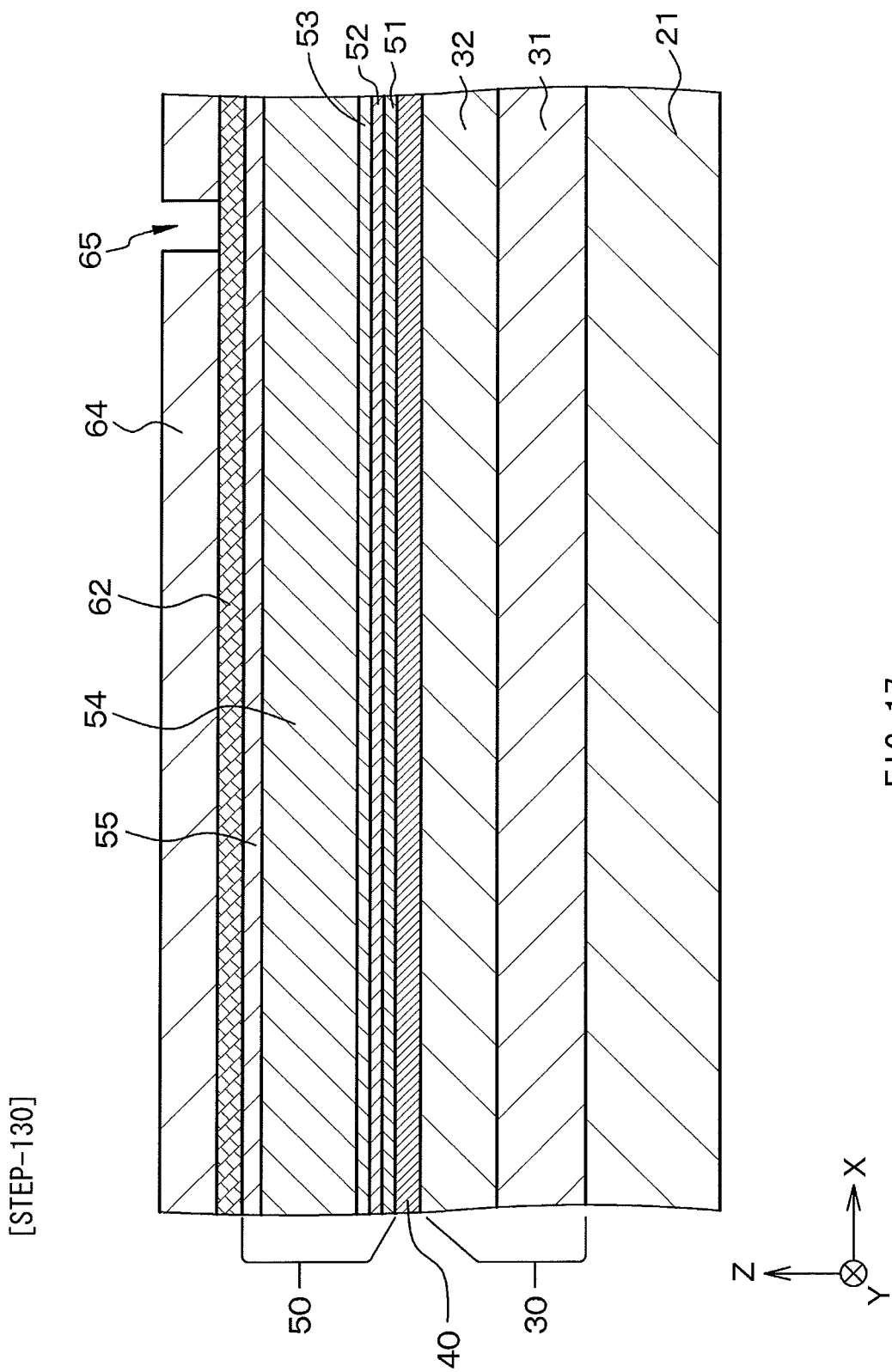
FIG. 17 is a schematic partial end view of the substrate and the like for describing the method of manufacturing the laser diode element in Example 1 following FIG. 16B.

A method of manufacturing the laser diode element in Example 1 will be described below referring to FIGS. 15A, 15B, 16A, 16B, and 17. It is to be noted that FIGS. 15A, 15B, 16A, and 16B are schematic partial sectional views of a substrate and the like taken along a YZ plane, and FIG. 17 is a schematic partial end view of the substrate and the like taken along an XZ plane.

[Step-100]

First, a laminate structure body configured by laminating, in order, the first compound semiconductor layer 30 of the first conductivity type (the n-type conductivity type) made of a GaN-based compound semiconductor, the third compound semiconductor layer (active layer) 40 made of a GaN-based compound semiconductor and including the light emission region (gain region) 41 and the saturable absorption region 42, and the second compound semiconductor layer 50 of the second conductivity type (the p-type conductivity type) made of a GaN-based compound semiconductor, the second conductivity type being different from the first conductivity type is formed on a base, more specifically, on a (0001) plane of the n-type GaN substrate 21 by a known MOCVD method (refer to FIG. 15A).

[Step-110]

After that, the second electrode 62 is formed on the second compound semiconductor layer 50. More specifically, a Pd layer 63 is entirely formed by a vacuum deposition method (refer to FIG. 15B), and then a resist layer for etching is formed on the Pd layer 63 by a photolithography technique. Then, a part not covered with the resist layer for etching of the Pd layer 63 is removed with use of aqua regia, and then the resist layer for etching is removed. Thus, a structure illustrated in FIG. 16A is allowed to be obtained. It is to be noted that the second electrode 62 may be formed on the second compound semiconductor layer 50 by a liftoff method.

[Step-120]

Next, the ridge stripe structure 56 is formed by etching a part or a whole of the second compound semiconductor layer 50 with use of the second electrode 62 as an etching mask. More specifically, a part of the second compound semiconductor layer 50 is etched by a RIE method using a $Cl_2$ gas with use of the second electrode 62 as an etching mask. Thus, a structure illustrated in FIG. 16B is allowed to be obtained. As the ridge stripe structure 56 is formed through a self-alignment system with use of, as an etching mask, the patterned second electrode 62, misalignment does not occur between the second electrode 62 and the ridge stripe structure 56.

[Step-130]

After that, a resist layer 64 for forming the separation groove in the second electrode 62 is formed (refer to FIG. 17). It is to be noted that a reference numeral 65 indicates an opening disposed in the resist layer 64 to form the separation groove. Next, the separation groove 62C is formed in the second electrode 62 by a wet-etching method with use of the resist layer 64 as a wet-etching mask to separate the second electrode 62 by the separation groove 62C into the first section 62A and the second section 62B. More specifically, the separation groove 62C is formed in the second electrode 62 by immersing the entire structure in aqua regia used as an etchant for approximately 10 seconds. Then, the resist layer 64 is removed. Thus, a structure illustrated in FIGS. 3 and 4 is allowed to be obtained. When the wet-etching method, but not a dry-etching method, is adopted in such a manner, optical and electrical characteristics of the second compound semiconductor layer 50 are not deteriorated. Therefore, light emission characteristics of the laser diode element are not deteriorated. It is to be noted that, in the case where the dry-etching method is adopted, internal loss $\alpha_i$ of the second compound semiconductor layer 50 may be increased to cause an increase in threshold voltage or a decline in light output. In this case, $ER_0/ER_1 \approx 1 \times 10^2$ is established, where the etching rate of the second electrode 62 is $ER_0$, and the etching rate of the laminate structure body is $ER_1$. Since there is a high etching selection ratio between the second electrode 62 and the second compound semiconductor layer 50, the second electrode 62 is allowed to be etched reliably without etching the laminate structure body (or with only slightly etching the laminate structure body). It is to be noted that it is desirable to satisfy $ER_0/ER_1 \leq 1 \times 10$, preferably $ER_0/ER_1 \leq 1 \times 10^2$.

The second electrode 62 may have a laminate structure including a lower metal layer made of palladium (Pd) with a thickness of 20 nm and an upper metal layer made of nickel (Ni) with a thickness of 200 nm. In wet-etching with use of aqua regia, the etching rate of nickel is approximately 1.25 times as high as that of palladium.

[Step-140]

After that, the formation of an n-side electrode, cleavage of a substrate, and the like are performed, and packaging is further performed, thereby allowing the laser diode element 10 to be formed.

Typically, resistance R ($\Omega$) of a semiconductor layer is represented by the following formula with use of resistivity $\rho$ ($\Omega \cdot m$) of a material forming the semiconductor layer, the length $X_0$ (m) of the semiconductor layer, the sectional area S ($m^2$) of the semiconductor layer, carrier density n ($cm^{-3}$), electrical charge e (C), and mobility $\mu$ ($m^2/Vs$).

$$R = (\rho \cdot X_0)/S$$
$$= X_0/(n \cdot e \cdot \mu \cdot S)$$

Since the mobility of a p-type GaN-based semiconductor is two or more orders of magnitude smaller than that of a p-type GaAs-based semiconductor, electrical resistance is easily increased. Therefore, it is clear from the above formula that a laser diode element including a ridge stripe structure with a small sectional area has large electrical resistance.

As a result of measuring electrical resistance between the first section 62A and the second section 62B of the second electrode 62 of the formed laser diode element 10 by a four-terminal method, the electrical resistance between the first section 62A and the second section 62B of the second electrode 62 was 15 k$\Omega$ in the case where the width of the separation groove 62C was 20 µm. Moreover, when, in the formed laser diode element 10, a DC current was passed from the first section 62A of the second electrode 62 to the first electrode 61 through the light emission region 41 to create a forward bias state, and an electric field was applied to the saturable absorption region 42 by applying a reverse bias voltage between the first electrode 61 and the second section 62B of the second electrode 62, a self-pulsation operation was allowed to be performed. In other words, the electrical resistance between the first section 62A and the second section 62B of the second electrode 62 was 10 or more times as high as the electrical resistance between the second electrode 62 and the first electrode 61, or $1 \times 10^2 \Omega$ or more. Therefore, a leakage current flowing from the first section 62A of the second electrode 62 to the second section 62B is allowed to be reliably suppressed, and as a result, the light emission region 41 is allowed to be brought into a forward bias state, and the saturable absorption region 42 is allowed to be reliably brought into a reverse bias state, thereby allowing a single-mode self-pulsation operation to be reliably achieved.

Example 2

Figure 5A:
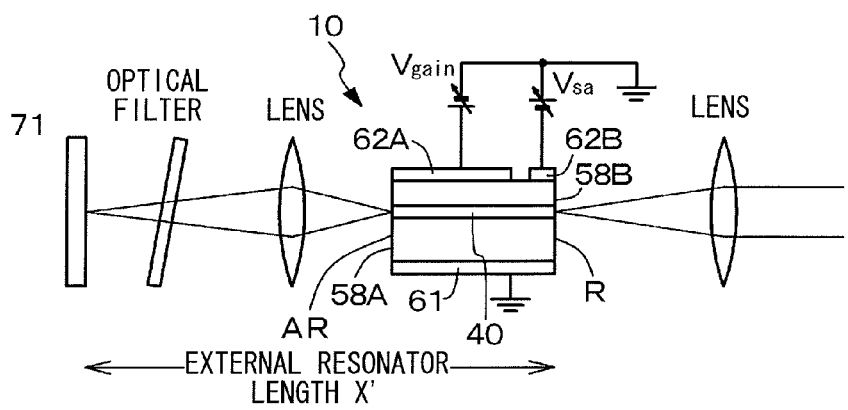
FIGS. 5A and 5B are conceptual diagrams of a laser diode element assembly of Example 2.
Figure 5B:
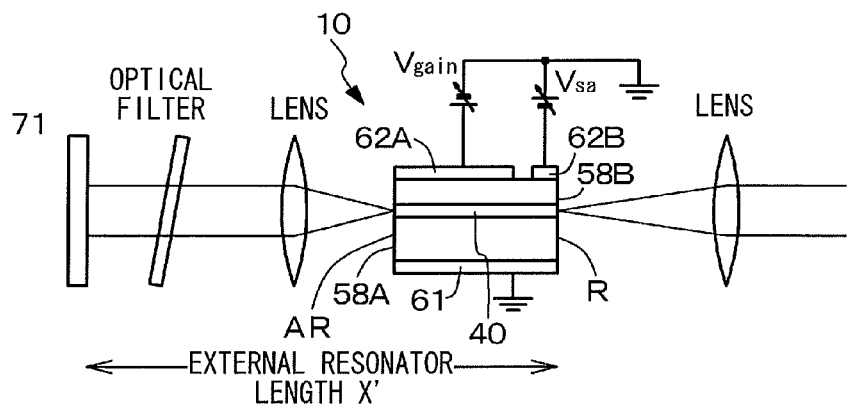

Example 2 relates to the laser diode element assemblies according to the second and third embodiments of the application. Conceptual diagrams of the laser diode element assembly of Example 2 are illustrated in FIGS. 5A and 5B. It is to be noted that an example illustrated in FIG. 5A is of a condensing type, and an example illustrated in FIG. 5B is of a collimating type.

In the laser diode element assembly of Example 2, laser light is emitted from one end surface 58A of the ridge stripe structure 56, and the laser light is reflected by a light reflector 71 to be returned to the laser diode element 10, and a part of the laser light exits to outside from the other end surface 58B of the ridge stripe structure 56. Moreover, in Example 2, the light reflector 71 or an external resonator 71 is configured of a total reflection mirror. Then, an external resonator structure is configured of the other end surface 58B of a laser diode element in which a reflective coating layer (R) is formed closer to the saturable absorption region 42 (the other end surface 58B) and the light reflector (external resonator) 71, and an optical pulse is extracted from the saturable absorption region 42. An antireflective coating layer or a low-reflective coating layer (AR) is formed on the one end surface 58A closer to the light emission region (gain region) 41 of the laser diode element.

The configuration and structure of the laser diode element assembly of Example 2 are similar to those of the laser diode element assembly of Example 1 except for the above-described points, and will not be further described in detail. It is to be noted that, even in Example 2, the minimum width $W_{min}$, and the maximum width $W_{max}$ of the ridge stripe structure 56 satisfy $1<W_{max}/W_{min}<3.3$ or $6 \leq W_{max}/W_{min}13.3$, and laser light exiting to outside is single-mode light.

It is to be noted that the width on the one end surface 58A of the ridge stripe structure 56 is the maximum width $W_{max}$, and the width on the other end surface 58B of the ridge stripe structure 56 is the minimum width $W_{min}$. The ridge stripe structure 56 has a so-called flare structure, and the minimum width $W_{min}$ of the ridge stripe structure 56 satisfies $1 \times 10^{-6}$ m $\geq W_{min} \leq 3 \times 10^{-6}$ m. Moreover, as in the case of Example 1, the laser diode element 10 is configured of a multielectrode type laser diode element (more specifically, a bisection type laser diode element), and the saturable absorption region 42 is disposed in a portion of the laminate structure body, the portion located closer to the other end surface 58B opposite to the one end surface 58A. In Example 2, as results of various tests, in a relationship between $W_{max}/W_{min}$, pulsed oscillation/continuous-wave oscillation, and single-mode/multimode, results similar to those in Example 1 were obtained.

Although the present application is described referring to preferred examples, the application is not limited thereto. Configurations and structures of the laser diode element and the laser diode element assembly described in the preferred examples are examples, and may be modified as appropriate. Moreover, in the examples, various values are indicated, but the values are also examples; therefore, for example, when the specifications of the laser diode element to be used are changed, the values are also changed.

Figure 18A:
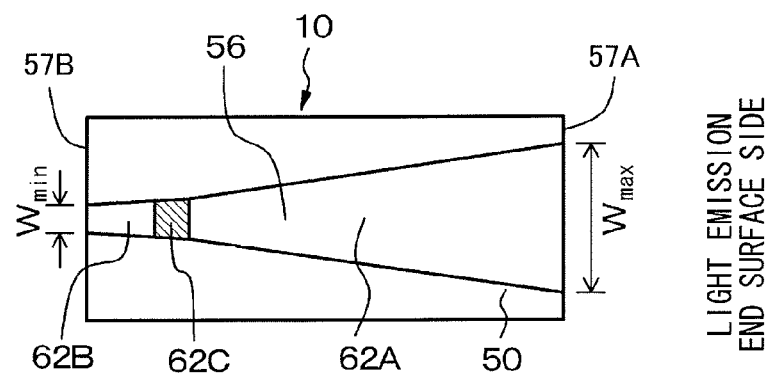
FIGS. 18A and 18B are schematic plan views of modifications of the laser diode elements in Example 1 or Example 2.
Figure 18B:
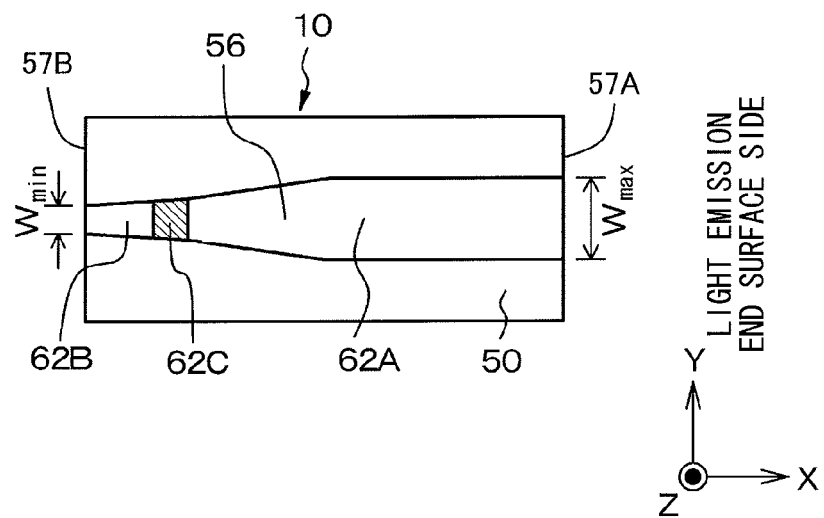

For example, in a modification of the laser diode element 10 illustrated in a schematic plan view in FIG. 18A, the ridge stripe structure 56 has the maximum width $W_{max}$ at the one end surface (light emission end surface) 57A, and the minimum width $W_{min}$ at the other end surface (light reflection end surface) 57B. Then, an angle where an end section corresponding to the first section 62A of the second electrode 62 of the ridge stripe structure 56 forms with an axis line of the ridge stripe structure 56 is larger than an angle where an end section corresponding to the second section 62B of the second electrode 62 of the ridge stripe structure 56 forms with the axis line of the ridge stripe structure 56. A modification of the laser diode element 10 illustrated in FIG. 18A is illustrated in a schematic plan view in FIG. 18B, and in the laser diode element 10, the width of a portion, corresponding to the first section 62A of the second electrode 62, of the ridge stripe structure 56 is the maximum width $W_{max}$ in a certain region from the one end surface (light emission end surface) 57A. Then, the width of the ridge stripe structure 56 is reduced from the certain region to the other end surface (light reflection end surface) 57B. In this case, the angle where the end section corresponding to the first section 62A of the second electrode 62 of the ridge stripe structure 56 forms with the axis line of the ridge stripe structure 56 is larger than the angle where the end section corresponding to the second section 62B of the second electrode 62 of the ridge stripe structure 56 forms with the axis line of the ridge stripe structure 56.

Moreover, the second electrode may have a laminate structure including a lower metal layer made of palladium (Pd) with a thickness of 20 nm and an upper metal layer made of nickel (Ni) with a thickness of 200 nm. It is to be noted that, in wet-etching with use of aqua regia, the etching rate of nickel is approximately 1.25 times as high as that of palladium.

Figure 13:
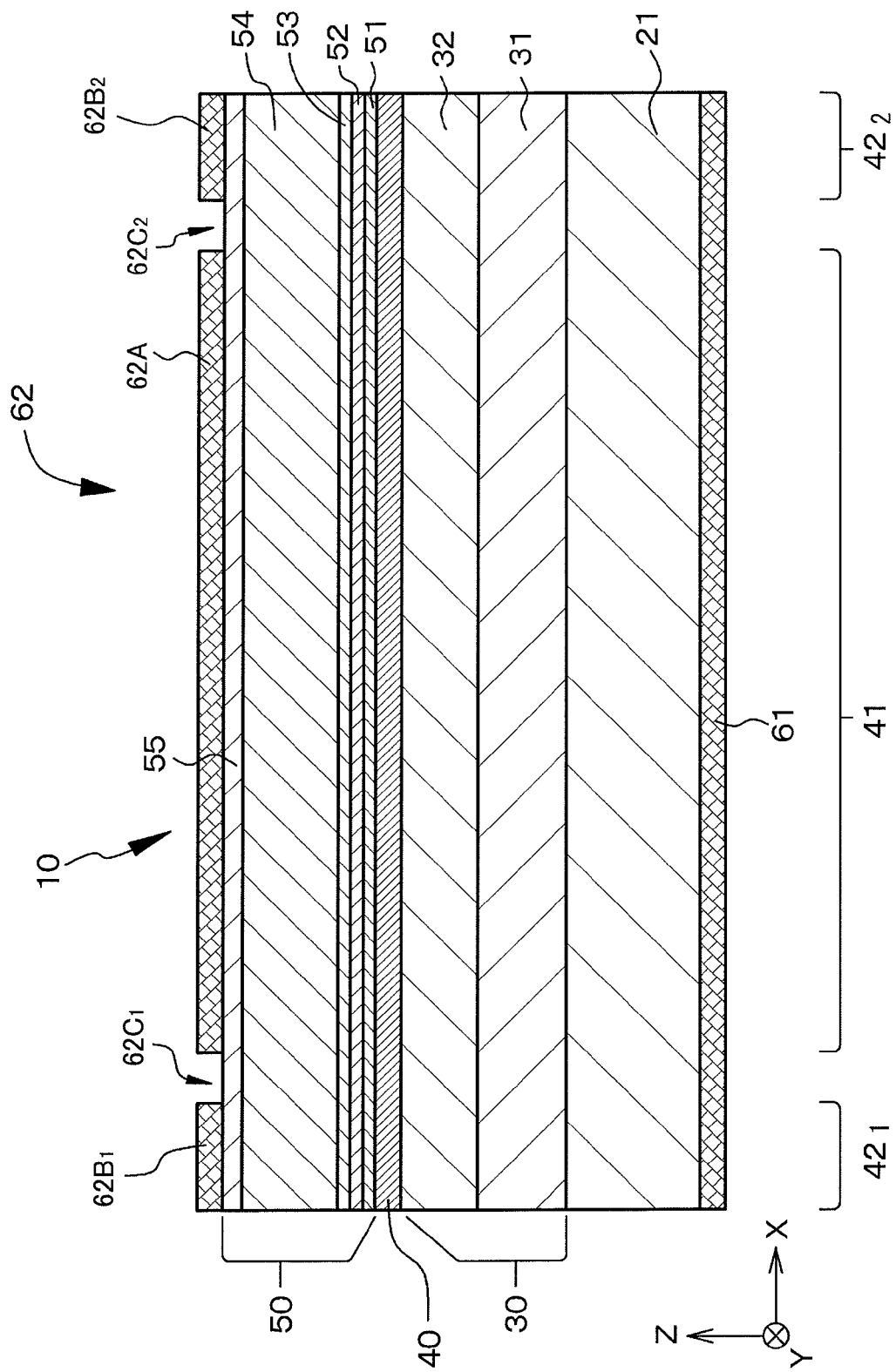
FIG. 13 is a schematic end view of a modification of the laser diode element in Example 1 or Example 2 taken along a direction where a resonator extends (a schematic end view taken along an XZ plane).

The number of the light emission regions 41 or the saturable absorption regions 42 is not limited to one. FIG. 13 illustrates a schematic end view (a schematic end view taken along an XZ plane) of a laser diode element including one first section 62A of the second electrode and two second sections $62B_1$ and $62B_2$ of the second electrode. In the laser diode element, one end of the first section 62A faces one second section $62B_1$ with one separation groove $62C_1$ in between, and the other end of the first section 62A faces the other second section $62B_2$ with the other separation groove $62C_2$ in between. Thus, one light emission region 41 is sandwiched between two saturable absorption regions $42_1$ and $42_2$.

Figure 14:
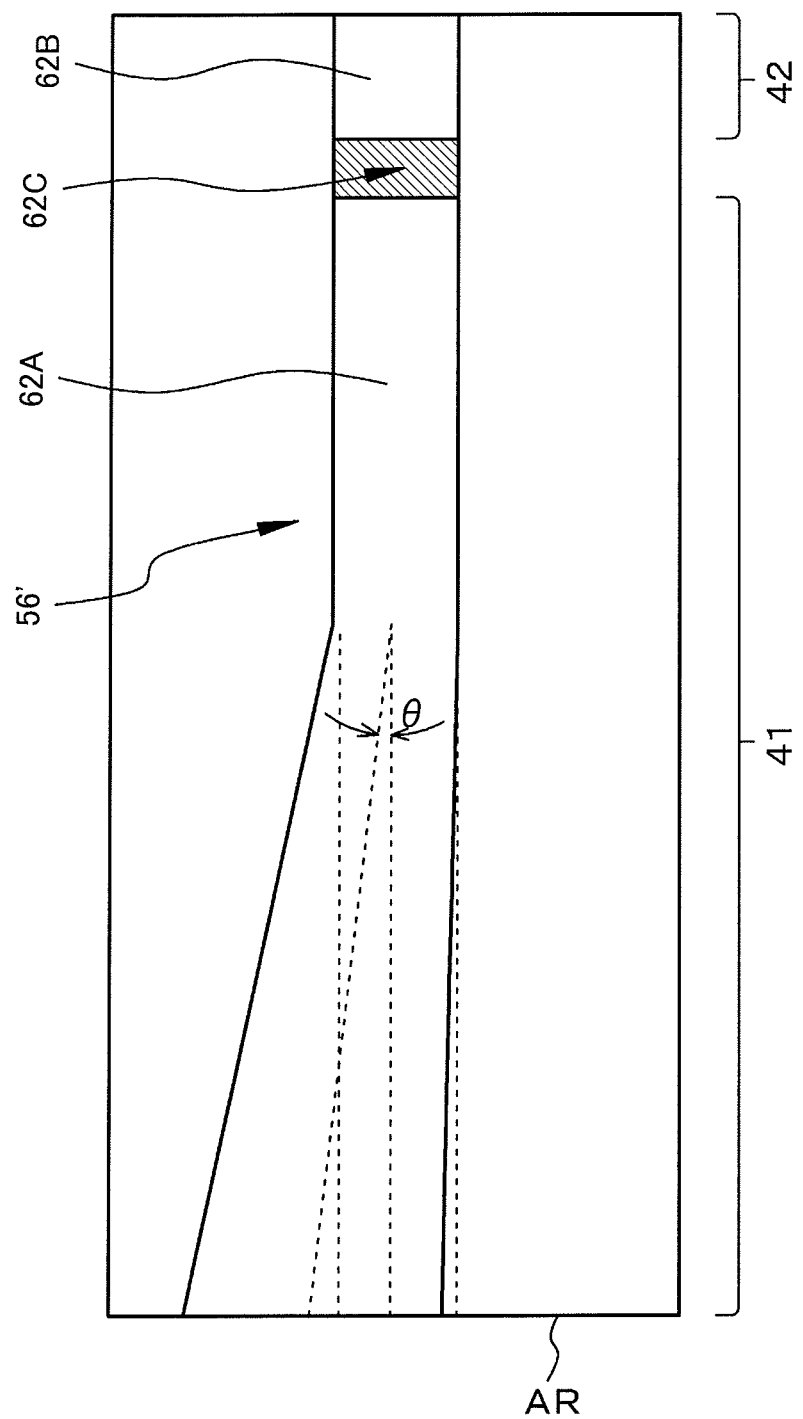
FIG. 14 is a schematic top view of a ridge stripe structure of a modification of the laser diode element in Example 1 or Example 2.

The laser diode element may be a laser diode element having an oblique ridge stripe type separate confinement heterostructure with an oblique waveguide. An example in which the laser diode element described in Example 1 or Example 2 includes the oblique ridge stripe structure having an oblique waveguide is illustrated in FIG. 14, which is a schematic top view of a ridge stripe structure 56'. The laser diode element includes a structure formed by combining two linear ridge stripe structures, and it is desirable that an angle θ where the two ridge stripe structures intersect with each other be, for example, $0<\theta \leq 10$ (degrees), preferably $0<\theta \leq 6$ (degrees). When the oblique ridge stripe structure is adopted, the reflectivity of an end surface coated with an antireflective coating AR is allowed to approach an ideal value of 0%, and as a result, advantages that the generation of laser light going round in the laser diode element is allowed to be prevented, and the generation of subsidiary laser light associated with main laser light is allowed to be suppressed are allowed to be obtained.

In the examples, the laser diode element is disposed on a C plane, i.e., a {0001} plane which is a polar plane of the n-type GaN substrate 21. In such a case, it may be difficult to electrically control saturable absorption by the QCSE effect (quantum confined Stark effect) by an internal electrical field caused by piezopolarization and spontaneous polarization in the third compound semiconductor layer. In other words, in some cases, to obtain a self-pulsation operation and a mode-locking operation, it may be necessary to increase the value of a DC current passed to the first electrode or the value of a reverse bias voltage applied to the saturable absorption region, or a sub-pulse component associated with a main pulse is generated, or it is difficult to synthesize an external signal and an optical pulse. To suppress such phenomena, the laser diode element may be disposed on a nonpolar plane such as an A plane, i.e., a $\{11-20\}$ plane, an M plane, i.e., a $\{1-100\}$ plane, or a $\{1-102\}$ plane, or a semipolar plane such as a $\{11-2n\}$ plane including a $\{11-24\}$ plane or a $\{11-22\}$ plane, a $\{10-11\}$ plane, or a $\{10-12\}$ plane. Thus, even if piezopolarization and spontaneous polarization are generated in third compound semiconductor layer of the laser diode element, piezopolarization is not generated in the thickness direction of the third compound semiconductor layer, and piezopolariztaion is generated in a direction substantially perpendicular to the thickness direction of the third compound semiconductor layer; therefore, an adverse effect caused by piezopolarization and spontaneous polarization is allowed to be eliminated. It is to be noted that the $\{11-2n\}$ plane means a nonpolar plane forming an angle of substantially 40° with respect to the C plane. Moreover, in the case where the laser diode element is disposed on the nonpolar plane or the semipolar plane, the limit (within a range of 1 nm to 10 nm both inclusive) of the thickness of the well layer and the limit (within a range of $2\times10^{18}$ cm$^{-3}$ to $1\times10^{20}$ cm$^{-3}$ both inclusive) of the doping concentration of the impurity in the barrier layer are allowed to be eliminated.

It is to be noted that the application is allowed to have the following configurations.

(1) A laser diode element assembly including:
a laser diode element; and
a light reflector,
in which the laser diode element includes
(a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type,
(b) a second electrode formed on the second compound semiconductor layer, and
(c) a first electrode electrically connected to the first compound semiconductor layer,
the laminate structure body includes a ridge stripe structure,
laser light is emitted from a first end surface of the ridge stripe structure, and a part of the laser light is reflected by the light reflector to be returned to the laser diode element, and a remaining part of the laser light exits to outside through the light reflector,
the laser light is reflected by a second end surface of the ridge stripe structure, and
a minimum width $W_{min}$ and a maximum width $W_{max}$ of the ridge stripe structure satisfy $1<W_{max}/W_{min}<3.3$ or $6\leq W_{max}/W_{min}\leq 13.3$.

(2) A laser diode element assembly including:
a laser diode element; and
a light reflector,
in which the laser diode element includes
(a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type,
(b) a second electrode formed on the second compound semiconductor layer, and
(c) a first electrode electrically connected to the first compound semiconductor layer,
the laminate structure body includes a ridge stripe structure,
laser light is emitted from a first end surface of the ridge stripe structure, and the laser light is reflected by the light reflector to be returned to the laser diode element,
a part of the laser light exits to outside from a second end surface of the ridge stripe structure, and
a minimum width $W_{min}$ and a maximum width $W_{max}$ of the ridge stripe structure satisfy $1<W_{max}/W_{min}<3.3$ or $6\leq W_{max}/W_{min}\leq 13.3$.

(3) A laser diode element assembly including:
a laser diode element; and
an external resonator,
in which the laser diode element includes
(a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type,
(b) a second electrode formed on the second compound semiconductor layer, and
(c) a first electrode electrically connected to the first compound semiconductor layer,
the laminate structure body includes a ridge stripe structure,
laser light is emitted from a first end surface of the ridge stripe structure, and the laser light is reflected by the external resonator to be returned to the laser diode element,
laser light emitted from the first end surface or a second end surface of the ridge stripe structure exits to outside, and
a minimum width $W_{min}$ and a maximum width $W_{max}$ of the ridge stripe structure satisfy $1<W_{max}/W_{min}<3.3$ or $6\leq W_{max}/W_{min}\leq 13.3$.

(4) The laser diode element assembly according to any one of (1) to (3), in which
the light reflector is configured of a mirror, a chirped mirror, a volume Bragg grating, or a fiber Bragg grating.

(5) The laser diode element assembly according to any one of (1) to (3), in which
the laser light exiting to outside is single-mode light.

(6) The laser diode element assembly according to any one of (1) to (3), in which
$1\times10^{-6}$ m $\leq W_{min} \leq 3\times10^{-6}$ m is satisfied.

(7) The laser diode element assembly according to any one of (1) to (3), in which
the third compound semiconductor layer further includes a saturable absorption region,
the second electrode is configured of a first section and a second section, the first section configured to create a forward bias state by passing a current to the first electrode through the light emission region, the second section configured to apply an electric field to the saturable absorption region, and the first section and the second section of the second electrode are separated by a separation groove.

(8) The laser diode element assembly according to (7), in which
the saturable absorption region is disposed in a portion of the laminate structure body, the portion located closer to an end surface opposite to an end surface where laser light exits to outside.

(9) The laser diode element assembly according to (7), in which
the laser light exiting to outside is pulsed oscillation laser light.

(10) The laser diode element assembly according to (9), in which the saturable absorption region is disposed in a portion of the laminate structure body, the portion located closer to an end surface opposite to an end surface where laser light exits to outside.

(11) The laser diode element assembly according to any one of (1) to (3), in which
the laser light exiting to outside is continuous-wave oscillation laser light.

(12) The laser diode element assembly according to any one of (1) to (3), in which
light intensity $E_{out}$ of laser light emitted from the laser diode element assembly satisfies $E_{out}/E_0 \geq 1.5$, where light intensity of laser light exiting to outside assuming that $W_{min} = W_{max}$ is established is $E_0$.

(13) A method of driving a laser diode element assembly, the laser diode element assembly including a laser diode element and a light reflector, the laser diode element including (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the third compound semiconductor layer further including a saturable absorption region, the second electrode being configured of a first section and a second section, the first section configured to create a forward bias state by passing a current to the first electrode through the light emission region, the second section configured to apply an electric field to the saturable absorption region, the first section and the second section of the second electrode being separated by a separation groove, the laminate structure body including a ridge stripe structure, laser light being emitted from a first end surface of the ridge stripe structure, and a part of the laser light being reflected by the light reflector to be returned to the laser diode element, and a remaining part of the laser light exiting to outside through the light reflector, the laser light being reflected by a second end surface of the ridge stripe structure, a minimum width $W_{min}$ and a maximum width $W_{max}$ of the ridge stripe structure satisfying $1 < W_{max}/W_{min} < 3.3$ or $6 \leq W_{max}/W_{min} \leq 13.3$, the method including:
while passing a current to the first electrode through the first section of the second electrode and the light emission region, passing a current to the second section of the second electrode through the first electrode and the saturable absorption region, thereby allowing pulsed oscillation to be performed; and while passing a current to the first electrode through the first section of the second electrode and the light emission region, passing a current to the first electrode through the second section of the second electrode and the light emission region, or not passing a current to the first electrode through the second section of the second electrode and the light emission region, thereby allowing continuous-wave oscillation to be performed.

(14) A method of driving a laser diode element assembly, the laser diode element assembly including a laser diode element and a light reflector, the laser diode element including (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the third compound semiconductor layer further including a saturable absorption region, the second electrode being configured of a first section and a second section, the first section configured to create a forward bias state by passing a current to the first electrode through the light emission region, the second section configured to apply an electric field to the saturable absorption region, the first section and the second section of the second electrode being separated by a separation groove, the laminate structure body including a ridge stripe structure, laser light being emitted from a first end surface of the ridge stripe structure, and the laser light being reflected by the light reflector to be returned to the laser diode element, a part of the laser light exiting to outside from a second end surface of the ridge stripe structure, a minimum width and a maximum width $W_{max}$ of the ridge stripe structure satisfying $1 < W_{max}/W_{min} < 3.3$ or $6 \leq W_{max}/W_{min} \leq 13.3$, the method including:
while passing a current to the first electrode through the first section of the second electrode and the light emission region, passing a current to the second section of the second electrode through the first electrode and the saturable absorption region, thereby allowing pulsed oscillation to be performed; and while passing a current to the first electrode through the first section of the second electrode and the light emission region, passing a current to the first electrode through the second section of the second electrode and the light emission region, or not passing a current to the first electrode through the second section of the second electrode and the light emission region, thereby allowing continuous-wave oscillation to be performed.

(15) A method of driving a laser diode element assembly, the laser diode element assembly including a laser diode element and an external resonator, the laser diode element including (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the third compound semiconductor layer further including a saturable absorption region, the second electrode being configured of a first section and a second section, the first section configured to create a forward bias state by passing a current to the first electrode through the light emission region, the second section configured to apply an electric field to the saturable absorption region, the first section and the second section of the second electrode being separated by a separation groove, the laminate structure body including a ridge stripe structure, laser light being emitted from a first end surface of the ridge stripe structure, and the laser light being reflected by the external resonator to be returned to the laser diode element, laser light emitted from the first end surface or a second end surface of the ridge stripe structure exiting to outside, a minimum width $W_{min}$, and a maximum width $W_{max}$ of the ridge stripe structure satisfying $1 < W_{max}/W_{min} < 3.3$ or $6 \leq W_{max}/W_{min} \leq 13.3$, the method including:

while passing a current to the first electrode through the first section of the second electrode and the light emission region, passing a current to the second section of the second electrode through the first electrode and the saturable absorption region, thereby allowing pulsed oscillation to be performed; and while passing a current to the first electrode through the first section of the second electrode and the light emission region, passing a current to the first electrode through the second section of the second electrode and the light emission region, or not passing a current to the first electrode through the second section of the second electrode and the light emission region, thereby allowing continuous-wave oscillation to be performed.

(16) The method of driving a laser diode element assembly according to any one of (13) to (15), in which the saturable absorption region is disposed in a portion of the laminate structure body, the portion located closer to an end surface opposite to an end surface where laser light exits to outside.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A laser diode element assembly comprising:
a laser diode element; and
a light reflector,
wherein the laser diode element includes (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the laminate structure body includes a ridge stripe structure, laser light is emitted from a first end surface of the ridge stripe structure, and a part of the laser light is reflected by the light reflector to be returned to the laser diode element, and a remaining part of the laser light exits to outside through the light reflector, the laser light is reflected by a second end surface of the ridge stripe structure, and a minimum width $W_{min}$ and a maximum width $W_{max}$ of the ridge stripe structure satisfy $1 < W_{max}/W_{min} < 3.3$ or $6 \leq W_{max}/W_{min} \leq 13.3$.

2. A laser diode element assembly comprising:
a laser diode element; and
a light reflector,
wherein the laser diode element includes (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the laminate structure body includes a ridge stripe structure, laser light is emitted from a first end surface of the ridge stripe structure, and the laser light is reflected by the light reflector to be returned to the laser diode element, a part of the laser light exits to outside from a second end surface of the ridge stripe structure, and a minimum width $W_{min}$ and a maximum width $W_{max}$ of the ridge stripe structure satisfy $1 < W_{max}/W_{min} < 3.3$ or $6 \leq W_{max}/W_{min} \leq 13.3$.

3. A laser diode element assembly comprising:
a laser diode element; and
an external resonator,
wherein the laser diode element includes (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the laminate structure body includes a ridge stripe structure, laser light is emitted from a first end surface of the ridge stripe structure, and the laser light is reflected by the external resonator to be returned to the laser diode element, laser light emitted from the first end surface or a second end surface of the ridge stripe structure exits to outside, and a minimum width $W_{min}$ and a maximum width $W_{max}$ of the ridge stripe structure satisfy $1<W_{max}/W_{min}<3.3$ or $6 \leq W_{max}/W_{min} \leq 13.3$.

4. The laser diode element assembly according to claim 1, wherein
the light reflector is configured of a mirror, a chirped mirror, a volume Bragg grating, or a fiber Bragg grating.

5. The laser diode element assembly according to claim 1, wherein
the laser light exiting to outside is single-mode light.

6. The laser diode element assembly according to claim 1, wherein
$1 \times 10^{-6}$ m $\leq W_{min} \leq 3 \times 10^{-6}$ m is satisfied.

7. The laser diode element assembly according to claim 1, wherein
the third compound semiconductor layer further includes a saturable absorption region,
the second electrode is configured of a first section and a second section, the first section configured to create a forward bias state by passing a current to the first electrode through the light emission region, the second section configured to apply an electric field to the saturable absorption region, and
the first section and the second section of the second electrode are separated by a separation groove.

8. The laser diode element assembly according to claim 7, wherein
the saturable absorption region is disposed in a portion of the laminate structure body, the portion located closer to an end surface opposite to an end surface where laser light exits to outside.

9. The laser diode element assembly according to claim 7, wherein
the laser light exiting to outside is pulsed oscillation laser light.

10. The laser diode element assembly according to claim 9, wherein
the saturable absorption region is disposed in a portion of the laminate structure body, the portion located closer to an end surface opposite to an end surface where laser light exits to outside.

11. The laser diode element assembly according to claim 1, wherein
the laser light exiting to outside is continuous-wave oscillation laser light.

12. The laser diode element assembly according to claim 1, wherein
light intensity $E_{out}$ of laser light emitted from the laser diode element assembly satisfies $E_{out}/E_0 \geq 1.5$, where light intensity of laser light exiting to outside assuming that $W_{min}=W_{max}$ is established is $E_0$.

13. A method of driving a laser diode element assembly, the laser diode element assembly including a laser diode element and a light reflector, the laser diode element including (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the third compound semiconductor layer further including a saturable absorption region, the second electrode being configured of a first section and a second section, the first section configured to create a forward bias state by passing a current to the first electrode through the light emission region, the second section configured to apply an electric field to the saturable absorption region, the first section and the second section of the second electrode being separated by a separation groove, the laminate structure body including a ridge stripe structure, laser light being emitted from a first end surface of the ridge stripe structure, and a part of the laser light being reflected by the light reflector to be returned to the laser diode element, and a remaining part of the laser light exiting to outside through the light reflector, the laser light being reflected by a second end surface of the ridge stripe structure, a minimum width $W_{min}$ and a maximum width $W_{max}$ of the ridge stripe structure satisfying $1<W_{max}/W_{min}<3.3$ or $6 \leq W_{max}/W_{min} \leq 13.3$, the method comprising:

while passing a current to the first electrode through the first section of the second electrode and the light emission region, passing a current to the second section of the second electrode through the first electrode and the saturable absorption region, thereby allowing pulsed oscillation to be performed; and while passing a current to the first electrode through the first section of the second electrode and the light emission region, passing a current to the first electrode through the second section of the second electrode and the light emission region, or not passing a current to the first electrode through the second section of the second electrode and the light emission region, thereby allowing continuous-wave oscillation to be performed.

14. A method of driving a laser diode element assembly, the laser diode element assembly including a laser diode element and a light reflector, the laser diode element including (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the third compound semiconductor layer further including a saturable absorption region, the second electrode being configured of a first section and a second section, the first section configured to create a forward bias state by passing a current to the first electrode through the light emission region, the second section configured to apply an electric field to the saturable absorption region, the first section and the second section of the second electrode being separated by a separation groove, the laminate structure body including a ridge stripe structure, laser light being emitted from a first end surface of the ridge stripe structure, and the laser light being reflected by the light reflector to be returned to the laser diode element, a part of the laser light exiting to outside from a second end surface of the ridge stripe structure, a minimum width and a maximum width $W_{max}$ of the ridge stripe structure satisfying $1<W_{max}/W_{min}<3.3$ or $6 \leqq W_{max}/W_{min} \leqq 13.3$, the method comprising:

while passing a current to the first electrode through the first section of the second electrode and the light emission region, passing a current to the second section of the second electrode through the first electrode and the saturable absorption region, thereby allowing pulsed oscillation to be performed; and while passing a current to the first electrode through the first section of the second electrode and the light emission region, passing a current to the first electrode through the second section of the second electrode and the light emission region, or not passing a current to the first electrode through the second section of the second electrode and the light emission region, thereby allowing continuous-wave oscillation to be performed.

15. A method of driving a laser diode element assembly, the laser diode element assembly including a laser diode element and an external resonator, the laser diode element including (a) a laminate structure body configured by laminating, in order, a first compound semiconductor layer of a first conductivity type made of a GaN-based compound semiconductor, a third compound semiconductor layer made of a GaN-based compound semiconductor and including a light emission region, and a second compound semiconductor layer of a second conductivity type made of a GaN-based compound semiconductor, the second conductivity type being different from the first conductivity type, (b) a second electrode formed on the second compound semiconductor layer, and (c) a first electrode electrically connected to the first compound semiconductor layer, the third compound semiconductor layer further including a saturable absorption region, the second electrode being configured of a first section and a second section, the first section configured to create a forward bias state by passing a current to the first electrode through the light emission region, the second section configured to apply an electric field to the saturable absorption region, the first section and the second section of the second electrode being separated by a separation groove, the laminate structure body including a ridge stripe structure, laser light being emitted from a first end surface of the ridge stripe structure, and the laser light being reflected by the external resonator to be returned to the laser diode element, laser light emitted from the first end surface or a second end surface of the ridge stripe structure exiting to outside, a minimum width $W_{min}$ and a maximum width $W_{max}$ of the ridge stripe structure satisfying $1<W_{max}/W_{min}<3.3$ or $6 \leqq W_{max}/W_{min} \leqq 13.3$, the method comprising:

while passing a current to the first electrode through the first section of the second electrode and the light emission region, passing a current to the second section of the second electrode through the first electrode and the saturable absorption region, thereby allowing pulsed oscillation to be performed; and while passing a current to the first electrode through the first section of the second electrode and the light emission region, passing a current to the first electrode through the second section of the second electrode and the light emission region, or not passing a current to the first electrode through the second section of the second electrode and the light emission region, thereby allowing continuous-wave oscillation to be performed.

16. The method of driving a laser diode element assembly according to claim 13, wherein the saturable absorption region is disposed in a portion of the laminate structure body, the portion located closer to an end surface opposite to an end surface where laser light exits to outside.

* * * * *